United States Patent
Abe et al.

(10) Patent No.: US 9,203,364 B2
(45) Date of Patent: Dec. 1, 2015

(54) DC OFFSET CANCELLER

(71) Applicant: Panasonic Corporation, Osaka (JP)

(72) Inventors: Takayuki Abe, Tokyo (JP); Koji Imamura, Shiga (JP); Kazutoshi Satou, Kyoto (JP); Shigeki Nakamura, Osaka (JP)

(73) Assignee: PANASONIC CORPORATION, Osaka (JP)

( * ) Notice: Subject to any disclaimer, the term of this patent is extended or adjusted under 35 U.S.C. 154(b) by 0 days.

(21) Appl. No.: 14/574,052

(22) Filed: Dec. 17, 2014

(65) Prior Publication Data
US 2015/0180431 A1 Jun. 25, 2015

(30) Foreign Application Priority Data

Dec. 25, 2013 (JP) ................................. 2013-267110
Nov. 28, 2014 (JP) ................................. 2014-241080

(51) Int. Cl.
*H03F 3/45* (2006.01)
*H03F 1/02* (2006.01)

(52) U.S. Cl.
CPC .......... *H03F 3/45071* (2013.01); *H03F 1/0233* (2013.01); *H03F 2203/45101* (2013.01); *H03F 2203/45112* (2013.01); *H03F 2203/45212* (2013.01)

(58) Field of Classification Search
USPC .................................... 330/259, 290, 109, 97
IPC ....................................................... H03F 3/45
See application file for complete search history.

(56) References Cited

U.S. PATENT DOCUMENTS

| | | | | |
|---|---|---|---|---|
| 5,430,765 A * | 7/1995 | Nagahori | ........... | H04B 10/6933 330/259 |
| 6,011,435 A * | 1/2000 | Takeyabu | ............ | H03F 3/45475 330/252 |
| 6,081,558 A * | 6/2000 | North | ........................ | H03F 3/08 250/214 AG |
| 2002/0109075 A1* | 8/2002 | Ono | ........................ | H03F 3/087 250/214 A |
| 2010/0303184 A1* | 12/2010 | Komori | .................. | H04L 25/061 375/354 |
| 2012/0194265 A1* | 8/2012 | Katsube | ............. | H03H 11/1252 327/554 |
| 2013/0187710 A1* | 7/2013 | Nagashima | ......... | H03F 3/45475 330/85 |
| 2015/0002221 A1* | 1/2015 | Van Helleputte | ... | H03F 3/45932 330/69 |

FOREIGN PATENT DOCUMENTS

| | | |
|---|---|---|
| JP | 2004-040157 | 2/2004 |
| JP | 2007-243636 | 9/2007 |

OTHER PUBLICATIONS

Hsieh-Hung Hsieh, , et al. "Design of Ultra-Low-Voltage RF Frontends With Complementary Current-Reused Architectures" IEEE Transactions on Microwave Theory and Techniques, vol. 55, No. 7, Jul. 2007, pp. 1445-1458.

* cited by examiner

*Primary Examiner* — Patricia T Nguyen
(74) *Attorney, Agent, or Firm* — Greenblum & Bernstein, P.L.C.

(57) ABSTRACT

Two LPFs are disposed on the output side of a differential amplifier to remove an AC component contained in an output signal output from a first output terminal of the differential amplifier and an AC component contained in an output signal output from a second output terminal of the differential amplifier. The lowpass filter voltage of the output signal output from the first output terminal with the AC component removed is input to one of input terminals of one of two comparators, and the lowpass filter voltage of the output signal output from the second output terminal with the AC component removed is input to one of input terminals of the other comparator.

20 Claims, 11 Drawing Sheets

DC OFFSET CANCELLER

BACKGROUND

1. Technical Field

The present invention relates to a DC offset canceller used in, for example, a current reuse type differential amplifier.

2. Description of the Related Art

In recent years, networks such as a wireless personal area network (WPAN) and a wireless sensor network have garnered much attention. To create such networks, compact and low power consumption wireless terminals are necessary. Since a large number of differential amplifiers are incorporated into a wireless terminal, it is significantly important to reduce power consumption of the differential amplifiers. To reduce the power consumption of a differential amplifier, it is important for the differential amplifier to support a low-voltage power supply and provide a high amplification factor even when the consumption current is small. For example, a current reuse type amplifier described in IEEE TRANSACTIONS ON MICROWAVE THEORY AND TECHNIQUES, Vol. 55, No. 7, JULY 2007 meets such requirements.

The direct current component (hereinafter simply referred to as a "DC component") of the output voltage of a differential amplifier typified by a current reuse type differential amplifier varies from differential amplifier to differential amplifier due to a difference in property between FETs that form a differential pair. Such a difference in a DC component is referred to as a "DC offset". The DC offset causes a decrease in the linearity and the amplification factor, which are the indices of the performance of a differential amplifier. In addition, the DC offset promotes degradation of the system performance of, for example, a wireless terminal having the differential amplifier mounted therein.

Some differential amplifiers include a DC offset canceller that cancels out the DC offset. For example, Japanese Unexamined Patent Application Publication Nos. 2007-243636 and 2004-040157 describe such differential amplifiers. The DC offset canceller described in Japanese Unexamined Patent Application Publication No. 2007-243636 compares the output voltage of a differential amplifier with a reference voltage. Thereafter, an AC component contained in the comparison result is removed, and a control signal based on the result is output to the differential amplifier so that the output voltage of the differential amplifier is the same as the reference voltage. To remove the AC component contained in the comparison result between the output voltage of the differential amplifier and the reference voltage, a lowpass filter (LPF) is mainly used. In contrast, the DC offset canceller described in Japanese Unexamined Patent Application Publication No. 2004-040157 extracts the DC component of each of the outputs of the differential amplifiers and removes the DC offset from the extracted DC components.

SUMMARY

When a current reuse type amplifier is used as a differential amplifier in the DC offset canceller described in Japanese Unexamined Patent Application Publication No. 2007-243636, the lowpass filter used for removing the AC component contained in a comparison result between the output voltage of the amplifier and the reference voltage degrades the properties of the amplifier.

In addition, the DC offset canceller described in Japanese Unexamined Patent Application Publication No. 2004-040157 does not include an input terminal for the reference voltage. Accordingly, the DC offset canceller cannot freely determine the output DC voltage. As a result, the large signal characterization deteriorates. In particular, the deterioration of the large signal characterization is prominent in super low power consumption amplifiers.

Accordingly, one non-limiting and exemplary embodiment provides a DC offset canceller that does not deteriorate the large signal characterization of a differential amplifier and that does not deteriorate the properties of the amplifier when a current reuse type differential amplifier is employed.

Additional benefits and advantages of the disclosed embodiments will be apparent from the specification and Figures. The benefits and/or advantages may be individually provided by the various embodiments and features of the specification and drawings disclosure, and need not all be provided in order to obtain one or more of the same.

In one general aspect, the techniques disclosed here feature a DC offset canceller for use in a differential amplifier. The DC offset canceller includes a first lowpass filter to which a voltage of a first output terminal of the differential amplifier is input, a first comparator to which an output of the first lowpass filter and a voltage generated by a reference voltage source are input, an output of the first comparator being input to a first output DC voltage control terminal of the differential amplifier, a second lowpass filter to which a voltage of a second output terminal of the differential amplifier is input, and a second comparator to which an output of the second lowpass filter and the reference voltage generated by the reference voltage source are input, an output of the second comparator being input to a second output DC voltage control terminal of the differential amplifier.

These general and specific aspects may be implemented using a system, a method, and a computer program, and any combination of systems, methods, and computer programs.

According to the present disclosure, a DC offset canceller can prevent deterioration of the large signal characterization of a differential amplifier. In addition, the DC offset canceller can prevent deterioration of the properties of the amplifier when a current reuse type differential amplifier is employed.

DETAILED DESCRIPTION

Figure 10:
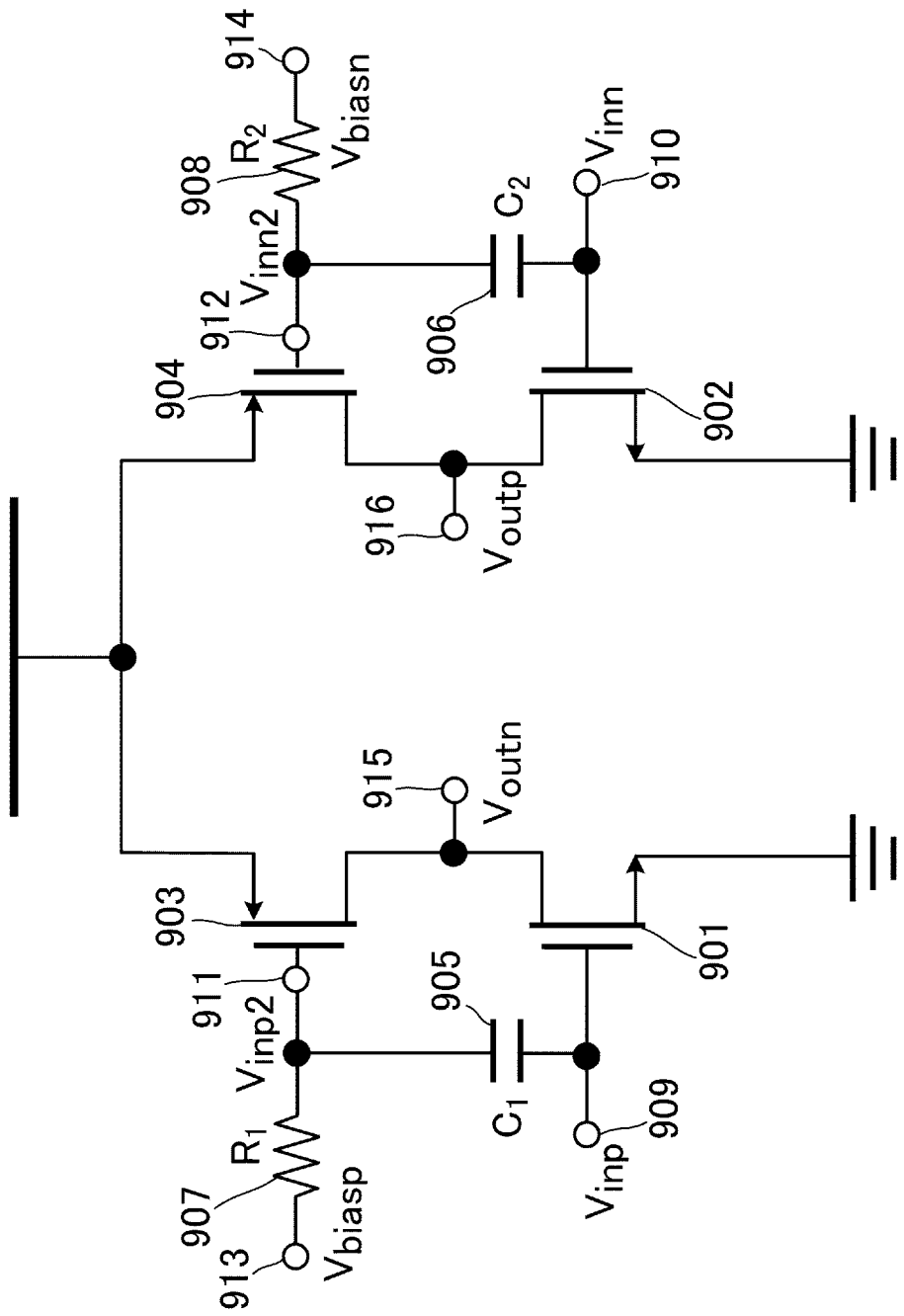
FIG. 10 is a circuit diagram illustrating the circuit configuration of a current reuse type differential amplifier described in IEEE TRANSACTIONS ON MICROWAVE THEORY AND TECHNIQUES, Vol. 55, No. 7, JULY 2007.

Exemplary embodiments of the present disclosure are described below with reference to the accompanying drawings.
Underlying Knowledge Forming Basis of the Present Invention Disclosure FIG. 10 is a circuit diagram illustrating the circuit configuration of a current reuse type differential amplifier described in IEEE TRANSACTIONS ON MICROWAVE THEORY AND TECHNIQUES, Vol. 55, No. 7, JULY 2007. As illustrated in FIG. 10, the current reuse type differential amplifier includes field effect transistors (FETs) 901 and 903 for amplifying one input signal and FETs 902 and 904 for amplifying the other input signal. The FETs 901 and 902 have the opposite polarity of the FETs 903 and 904. That is, each of the FETs 901 and 902 is an N-channel FET, and each of the FETs 903 and 904 is a P-channel FET.

The drain of the FET 901 is connected to the drain of the FET 903. The drain of the FET 902 is connected to the drain of the FET 904. An input terminal 909 serves as a terminal for inputting an input signal $V_{inp}$. The input signal $V_{inp}$ is input to the gate of the FET 901 via the input terminal 909. In addition, the input signal $V_{inp}$ is input to the gate of the FET 903 via a DC component removal capacitor 905. An input terminal 910 serves as an input terminal for inputting an input signal $V_{inn}$. The input signal $V_{inn}$ is input to the gate of the FET 902 via the input terminal 910. In addition, the input signal $V_{inn}$ is input to the gate of the FET 904 via a capacitor 906 for removing a DC component. An output DC voltage control terminal 913 serves as a terminal for inputting a bias voltage $V_{biasp}$. The voltage $V_{biasp}$ is input from the output DC voltage control terminal 913 to the gate of the FET 903 via a resistor 907. An output DC voltage control terminal 914 serves as a terminal for inputting a bias voltage $V_{biasn}$. The bias voltage $V_{biasn}$ is input from the output DC voltage control terminal 914 to the gate of the FET 904 via a resistor 908.

Each of the FETs 901 and 903 has a unique transconductance and outputs an AC current having a value obtained by multiplying the transconductance by the AC voltage of the input signal $V_{inp}$. The output AC current converted in accordance with the input AC voltage (i.e., the input signal $V_{inp}$) is multiplied by the output resistance (not illustrated) of the current reuse type differential amplifier so as to be converted into a voltage, which is obtained as an output AC voltage. Like the FETs 901 and 903, each of the FETs 902 and 904 has a unique transconductance and outputs an AC current having a value obtained by multiplying the transconductance by the input signal $V_{inn}$. The output AC current converted in accordance with the input AC voltage (i.e., the input signal $V_{inn}$) is multiplied by the output resistance (not illustrated) of the current reuse type differential amplifier so as to be converted into a voltage, which is obtained as an output AC voltage.

A differential amplifier typified by a current reuse type differential amplifier includes a number of FETs equal to twice that in a differential amplifier having a normal configuration. Accordingly, the total transconductance increases. That is, the amplification factor is higher than that of the differential amplifier having a normal configuration. In addition, a differential amplifier typified by a current reuse type differential amplifier is designed such that the channel lengths and channel widths of two FETs that form a differential pair are the same. However, in the manufacturing process, the channel lengths and channel widths of the FETs vary from FET to FET. As a result, the value of the direct current (DC) component of an output signal $V_{outn}$ output from an output terminal 915 (refer to FIG. 10) differs from the value of the DC component of an output signal $V_{outp}$ output from an output terminal 916. The difference between the different values of the DC components is referred to as a "DC offset". The DC offset causes a decrease in the linearity and the amplification factor, which are the indices of the performance of a differential amplifier. In addition, the DC offset promotes degradation of the system performance of, for example, a wireless terminal having the differential amplifier mounted therein.

As described above, since a DC offset occurs in a differential amplifier, a DC offset canceller having a function of cancelling out the DC offset has been actively developed (refer to, for example, Japanese Unexamined Patent Application Publication No. 2007-243636). As the basic operation performed by the DC offset canceller, the DC offset canceller outputs a control signal to be input to an output DC voltage control terminal (e.g., the output DC voltage control terminals 913 or 914 illustrated in FIG. 10) of a differential amplifier (refer to the bias voltages $V_{biasp}$ and $V_{biasn}$ illustrated in FIG. 10).

Figure 11:
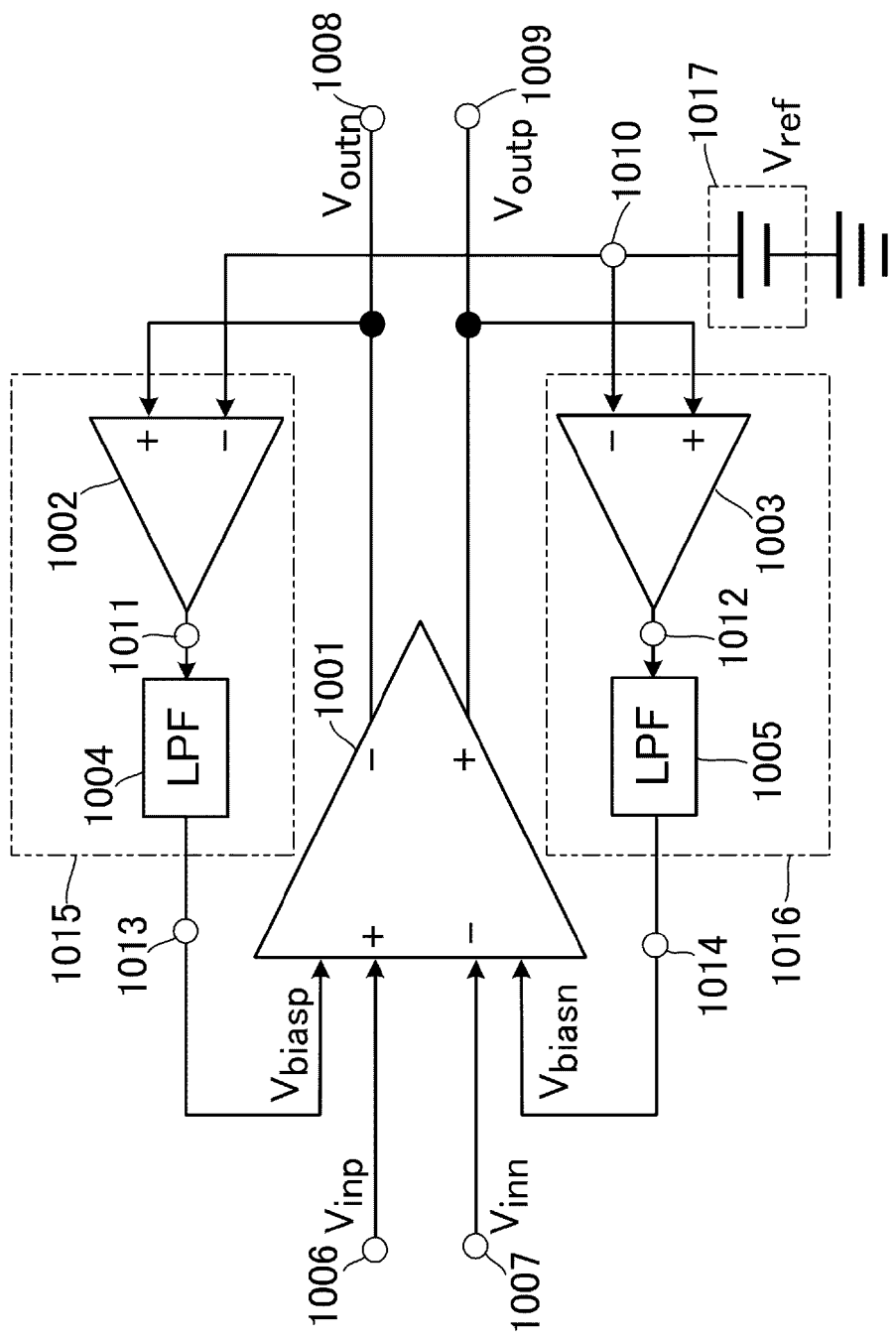
FIG. 11 is a circuit diagram of the circuit configuration of a DC offset canceller described in Japanese Unexamined Patent Application Publication No. 2007-243636 and a differential amplifier having the DC offset canceller connected thereto.

FIG. 11 is a circuit diagram illustrating the circuit configuration of DC offset cancellers 1015 and 1016 described in Japanese Unexamined Patent Application Publication No. 2007-243636 and a differential amplifier 1001 having the DC offset cancellers 1015 and 1016 connected thereto. For example, the differential amplifier 1001 illustrated in FIG. 11 is a current reuse type differential amplifier illustrated in FIG. 10. The DC offset canceller 1015 includes a comparator 1002 and a lowpass filter (LPF) 1004. The comparator 1002 compares the output signal $V_{outn}$ with a reference voltage $V_{ref}$ and outputs the result of comparison to an output terminal 1011. In such a case, the output signal $V_{outn}$ is a signal that is obtained by amplifying the input signal $V_{inp}$ input to an input terminal 1006 using the differential amplifier 1001 and that is output to an output terminal 1008. In addition, the reference voltage $V_{ref}$ is a voltage output from a reference voltage source 1017 to a reference voltage output terminal 1010.

The LPF 1004 removes an AC component contained in the output signal output from the comparator 1002. By using the bias voltage $V_{biasp}$ output from the LPF 1004 to an output terminal 1013, control is performed so that the voltage value of the output signal $V_{outn}$ output to the output terminal 1008 is the same as the reference voltage $V_{ref}$. As a result, the DC offset is removed.

Like the DC offset canceller 1015, the DC offset canceller 1016 includes a comparator 1003 and a lowpass filter (LPF)

1005. The comparator 1003 compares the output signal $V_{outp}$ with the reference voltage $V_{ref}$ and outputs the result of comparison to an output terminal 1012. In such a case, the output signal $V_{outp}$ is a signal that is obtained by amplifying the input signal $V_{inn}$ input to an input terminal 1007 using the differential amplifier 1001 and that is output to an output terminal 1009. In addition, the reference voltage $V_{ref}$ is a voltage output from the reference voltage source 1017 to the reference voltage output terminal 1010.

The LPF 1005 removes an AC component contained in the output signal of the comparator 1003. By using the bias voltage $V_{biasn}$ output from the LPF 1005 to an output terminal 1014, control is performed so that the voltage value of the output signal $V_{outp}$ output to the output terminal 1009 is the same as the reference voltage $V_{ref}$. As a result, the DC offset is removed.

Note that like the DC offset canceller described in Japanese Unexamined Patent Application Publication No. 2004-040157, some DC offset cancellers extract the output DC information regarding each of the differential amplifiers and remove the DC offset from the extracted DC component.

Figure 12:
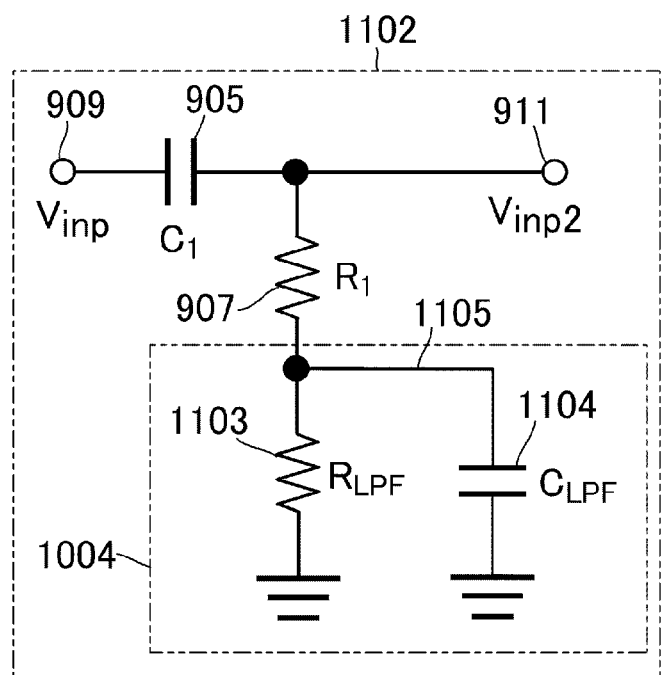
FIG. 12 is a circuit diagram of an equivalent circuit of an input terminal of the differential amplifier having an existing DC offset canceller connected thereto.

Note that the LPF 1004 of the DC offset canceller 1015 and the LPF 1005 of the DC offset canceller 1016 illustrated in FIG. 11 function as the load imposed on an input terminal 911 from the viewpoint of the input terminal 909 illustrated in FIG. 10 and the load imposed on an input terminal 912 from the viewpoint of the input terminal 910 illustrated in FIG. 10, respectively. Accordingly, the properties of the differential amplifier 1001 are degraded. FIG. 12 is a circuit diagram of an equivalent circuit of a signal path from the input terminal 909 to the input terminal 911. In an equivalent circuit 1102 illustrated in FIG. 12, the capacitor 905, the resistor 907, and the input terminals 909 and 911 are the same as those in FIG. 10. In addition, in the equivalent circuit 1102 illustrated in FIG. 12, the equivalent circuit of the LPF 1004 is expressed by using a resistor $R_{LPF}$ 1103 and a capacitor $C_{LPF}$ 1104.

In the equivalent circuit 1102, the transfer function of a path from the input signal $V_{inp}$ to an input signal $V_{inp2}$ is expressed as follows:

$$V_{inp2}/V_{inp} = (C_{LPF}*R_{LPF}*C_1*R_1*s^2 + C_1(R_1+R_{LPF})s)/(C_{LPF}*R_{LPF}*C_1*R_1*s^2 + (C_1*R_1+C_1*R_{LPF} + C_{LPF}*R_{LPF})s + 1).$$

Figure 13:
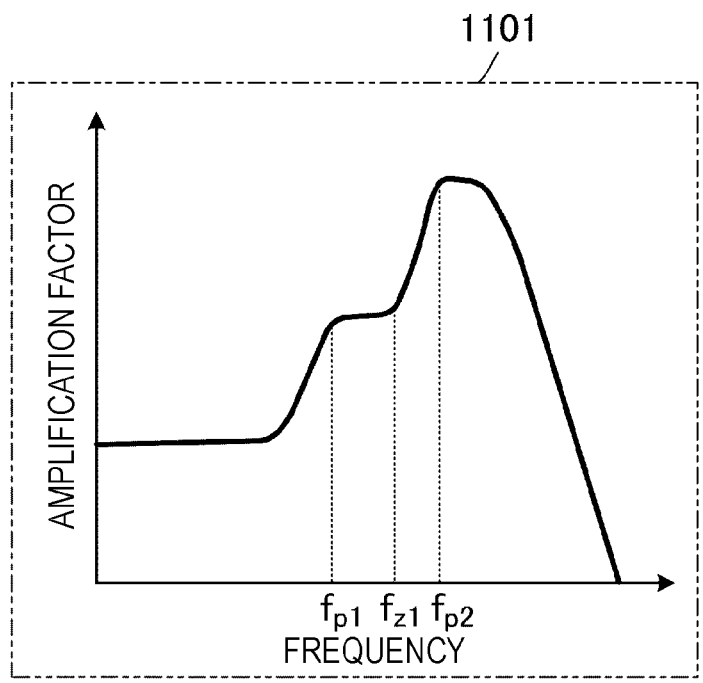
FIG. 13 illustrates the frequency characteristics of the amplification factor of the differential amplifier using an existing DC offset canceller.

As can be seen from the transfer function, a pole frequency $f_{p1}$ (refer to FIG. 13) and a Zeros $f_{z1}$ (refer to FIG. 13) that do not exist in the characteristics of the differential amplifier illustrated in FIG. 10 appear at all times. Accordingly, when the DC offset cancellers 1015 and 1016 are used in the differential amplifier 1001, the amplification factor on the low frequency range side significantly decreases, as indicated by the frequency characteristic 1101 of the amplification factor in FIG. 13. When, in a wireless terminal including the differential amplifier 1001, the amplification factor on the low frequency side decreases, a circuit that compensates for the decrease on the low frequency side of the differential amplifier 1001 may be needed, or an oscillation accuracy of a local oscillator that accounts for most of the total power consumption needs to be increased. As a result, the total power consumption of the wireless terminal significantly increases.

In contrast, the DC offset canceller described in Japanese Unexamined Patent Application Publication No. 2004-040157 does not include an input terminal of a reference voltage source. Accordingly, the DC offset canceller cannot freely determine the voltage values of the output signal $V_{outn}$ and the output signal $V_{outp}$. As a result, the large signal characterization is degraded. The degradation of the large signal characterization is particularly prominent in super low power consumption amplifiers.

A DC offset canceller that prevents a decrease in amplification factor of a differential amplifier on the low frequency side, an increase in power consumption of other circuits of a wireless terminal that includes the differential amplifier, and degradation of the large signal characterization is described below.

First Exemplary Embodiment

Figure 1:
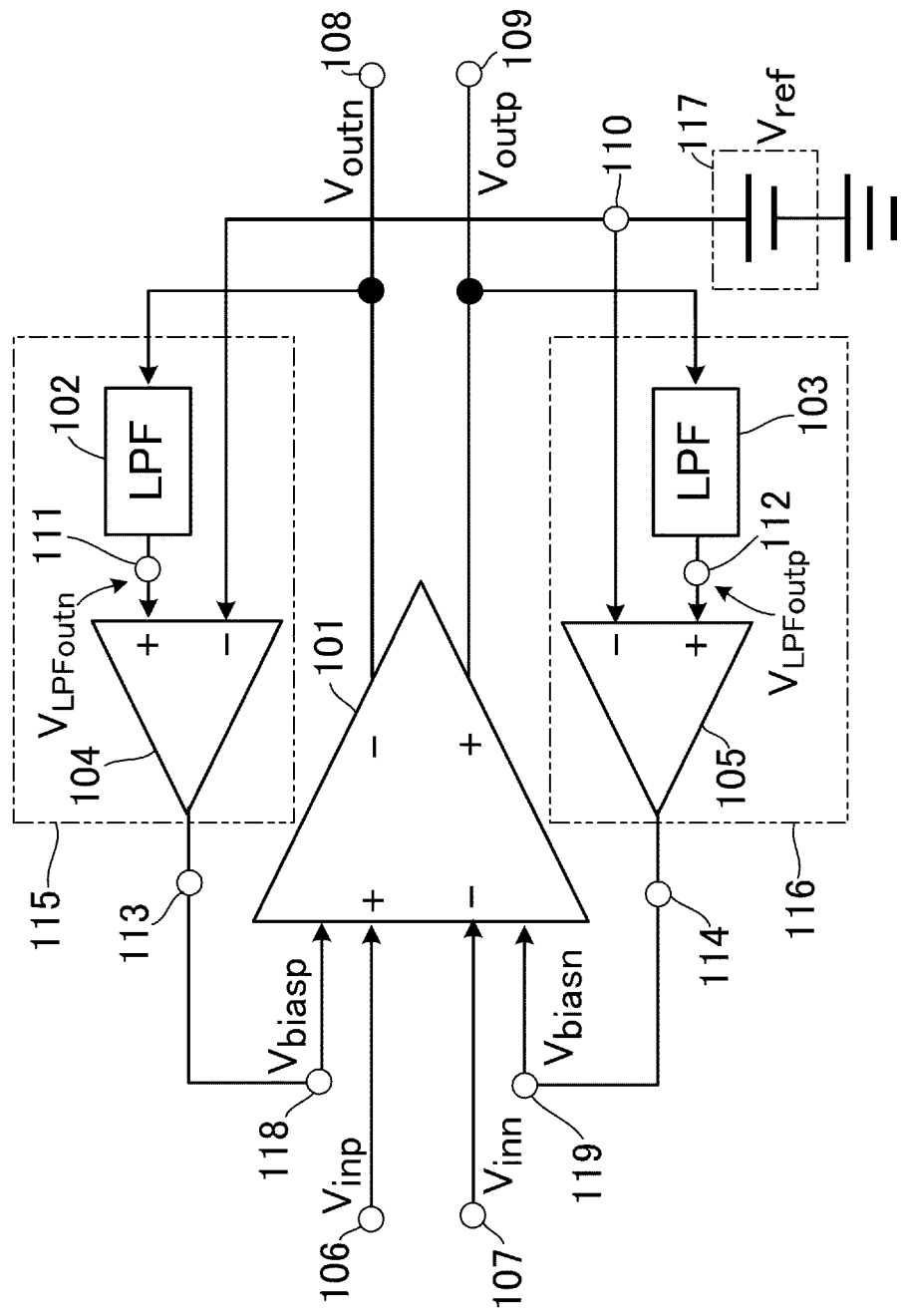
FIG. 1 is a circuit diagram illustrating an example of the circuit configuration of a DC offset canceller and a differential amplifier connected to the DC offset canceller according to a first exemplary embodiment.

FIG. 1 is a circuit diagram illustrating an example of the circuit configuration of DC offset cancellers 115 and 116 and a current reuse type differential amplifier 101 (hereinafter simply referred to as a "differential amplifier 101") connected to the DC offset cancellers 115 and 116 according to a first exemplary embodiment. As illustrated in FIG. 1, the DC offset canceller 115 includes an LPF (a first lowpass filter) 102 to which the voltage of a first output terminal 108 of the current reuse type differential amplifier 101 is input and a comparator (a first comparator) 104 to which the output of the LPF 102 and a reference voltage $V_{ref}$ generated by a reference voltage source 117 are input. The output of the comparator 104 is input to a first output DC voltage control terminal 118 of the current reuse type differential amplifier 101.

The current reuse type differential amplifier 101 amplifies an input signal $V_{inp}$ input to a first input terminal 106 and outputs an output signal $V_{outn}$ to the first output terminal 108. The LPF 102 removes an AC component contained in the output signal $V_{outn}$. The comparator 104 compares a lowpass filter voltage $V_{LPFoutn}$ output from the LPF 102 to an output terminal 111 with the reference voltage $V_{ref}$ output from the reference voltage source 117 to a reference voltage output terminal 110 and outputs the result of comparison to an output terminal 113. Control is performed using the bias voltage $V_{biasp}$ (the output DC voltage control signal) output from the comparator 104 to the output terminal 113 so that the output signal $V_{outn}$ output to the first output terminal 108 of the current reuse type differential amplifier 101 is the same as the reference voltage $V_{ref}$. As a result, the DC offset is removed.

The DC offset canceller 116 includes an LPF (a second lowpass filter) 103 to which the voltage of a second output terminal 109 of the current reuse type differential amplifier 101 is input and a comparator (a second comparator) 105 to which the output of the LPF 103 and the reference voltage $V_{ref}$ generated by the reference voltage source 117 are input. The output of the comparator 105 is input to a second output DC voltage control terminal 119 of the current reuse type differential amplifier 101.

The current reuse type differential amplifier 101 amplifies the input signal $V_{inn}$ input to a second input terminal 107 and outputs the output signal $V_{outp}$ to the second output terminal 109. The LPF 103 removes an AC component contained in the output signal $V_{outp}$. The comparator 105 compares a lowpass filter voltage $V_{LPFoutp}$ output from the LPF 103 to an output terminal 112 with the reference voltage $V_{ref}$ output from the reference voltage source 117 to a reference voltage output terminal 110 and outputs the result of comparison to an output terminal 114. Control is performed using the bias voltage $V_{biasn}$ output from the comparator 105 to the output terminal 114 so that the output signal $V_{outp}$ output to the second output terminal 109 of the differential amplifier 101 is the same as the reference voltage $V_{ref}$. As a result, the DC offset is removed.

Figure 2:
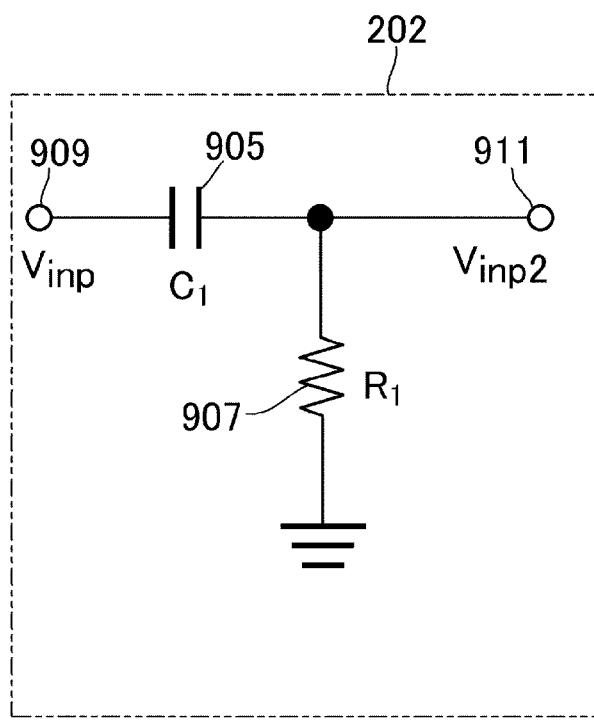
FIG. 2 is a circuit diagram illustrating an equivalent circuit of an input terminal of the differential amplifier connected to the DC offset canceller according to the first exemplary embodiment.

According to the DC offset cancellers 115 and 116 having such a configuration, even when the differential amplifier 101 has a configuration that is the same as that of the differential amplifier illustrated in FIG. 10, the LPFs 102 and 103 do not serve as the load of the input terminals 911 and 912 from the viewpoint of the input terminals 909 and 910, respectively. Accordingly, the equivalent circuit of a signal path from the input terminal 909 to the input terminal 911 can be expressed as a equivalent circuit 202 illustrated in FIG. 2. In the equivalent circuit 202, the transfer function of a path from the input signal $V_{inp}$ to an input signal $V_{inp2}$ is expressed as follows:

$$V_{inp2}/V_{inp}=(C_1*R_1*s)/(1+C_1*R_1*s).$$

Figure 3:
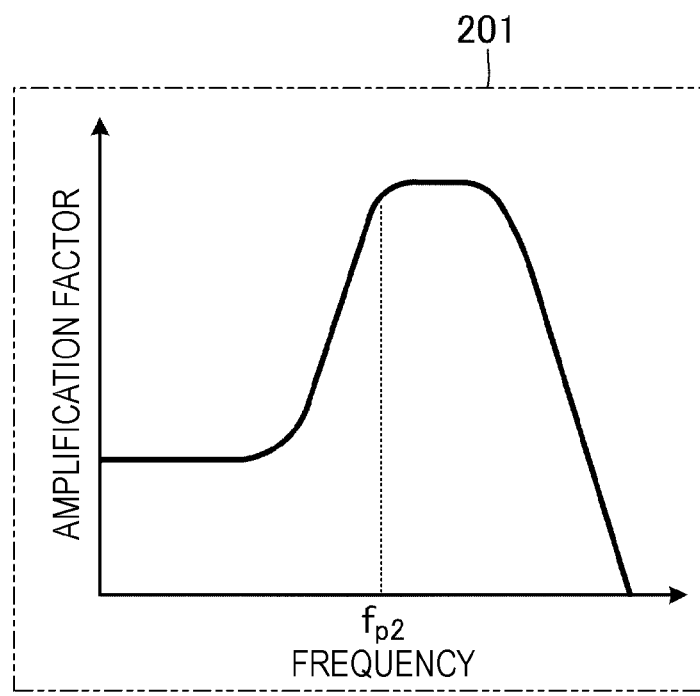
FIG. 3 illustrates the frequency characteristics of the amplification factor of the differential amplifier using the DC offset canceller according to the first exemplary embodiment.

Thus, as indicated by a frequency characteristic 201 of the amplification factor illustrated in FIG. 3, a pole frequency $f_{p1}$ and a zero frequency $f_{z1}$ (refer to FIG. 13) that cause a problem in the differential amplifier 1001 using the existing DC offset cancellers 1015 and 1016 do not appear. Accordingly, the amplification factor on the low frequency side of the differential amplifier 101 does not decrease and, thus, the amplification factor of the differential amplifier 101 itself can be realized. In addition, an increase in power consumption of other circuits of the wireless terminal having the differential amplifier 101 incorporated thereinto does not occur. In this manner, a low power consumption system can be achieved.

Since the signal input terminal of the LPF 102 is connected to the first output terminal 108 of the differential amplifier 101 and the signal input terminal of the LPF 103 is connected to the second output terminal 109 of the differential amplifier 101, the LPFs 102 and 103 have impact on the output load of the differential amplifier 101. However, by sufficiently increasing the resistance values of the LPFs 102 and 103 with respect to the output resistance of the differential amplifier 101, the impact of the LPFs 102 and 103 on the output load of the differential amplifier 101 is negligible. Thus, the frequency characteristics of the amplification factor of the differential amplifier 101 are not degraded. By eliminating the impact caused by the DC offset cancellers 115 and 116, the amplification factor of the differential amplifier 101 indicated by the frequency characteristic 201 of the amplification factor illustrated in FIG. 3 can be provided.

Figure 4:
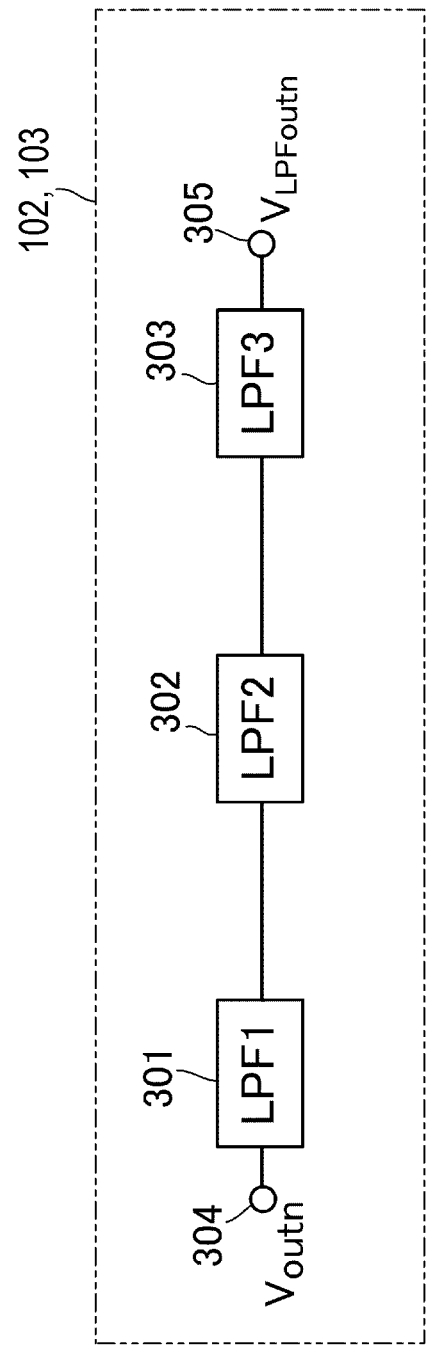
FIG. 4 illustrates an example of the circuit configuration of a lowpass filter that constitutes the DC offset canceller according to the first exemplary embodiment.

FIG. 4 illustrates an example of the circuit configurations of the LPFs 102 and 103 that constitute the DC offset cancellers 115 and 116, respectively, according to the first exemplary embodiment. As illustrated in FIG. 4, each of the LPFs 102 and 103 has a three-stage configuration in which LPFs 301, 302, and 303 are cascade-connected. The output signal $V_{outn}$ is input to a signal input terminal 304 of each of the LPFs 102 and 103, and a lowpass filter voltage $V_{LPFoutn}$ is output from a signal output terminal 305. Each of the LPFs 301, 302, and 303 is formed from a resistor and a capacitor. For example, a passive element, such as polysilicon, or an active element typified by a transistor, such as an FET, is used as a resistor in the LPF. In particular, when an FET is used as a resistor, the dimensions can be reduced from that when a passive element resistor, such as polysilicon, is used. In addition, by connecting the drain of a p-type FET to the drain of an n-type FET, connecting the source of the p-type FET to the source of the n-type FET, and using the drain terminal and the source terminal as the terminals of the FET resistor, the large signal characterization can be improved.

In addition, for example, a passive element, such as a metal-insulator-metal (MIM) capacitor or a metal-oxide-metal (MOM) capacitor, or an active element typified by a transistor, such as an FET, is used as a capacitor used in the LPF. In particular, when an FET is used as a capacitor, the dimensions can be reduced.

Note that each of the LPFs 301 to 303 may be formed from an inductor and a capacitor. A passive inductor formed from a passive element, such as a metal wiring line, or an active inductor formed from a transistor, such as an FET, is used as the inductor in the LPF. In particular, when an active inductor is used as the resistor, the dimensions can be reduced from that when a passive inductor is used. The capacitor is a passive element, such as an MIM capacitor or an MOM capacitor, or an active element typified by a transistor, such as an FET. The above-described advantage of such a capacitor can be provided. Note that the above-described lowpass filter may be an active filter formed from: one of an operational amplifier and a transformer conductance amplifier; a capacitor; and a resistor.

While the first exemplary embodiment has been described with reference to the DC offset cancellers 115 and 116 respectively including the LPFs 102 and 103 each having a three-stage configuration having the LPFs 301, 302, and 303, the number of stages is not limited to any number. For example, a single stage configuration may be employed.

Figure 5:
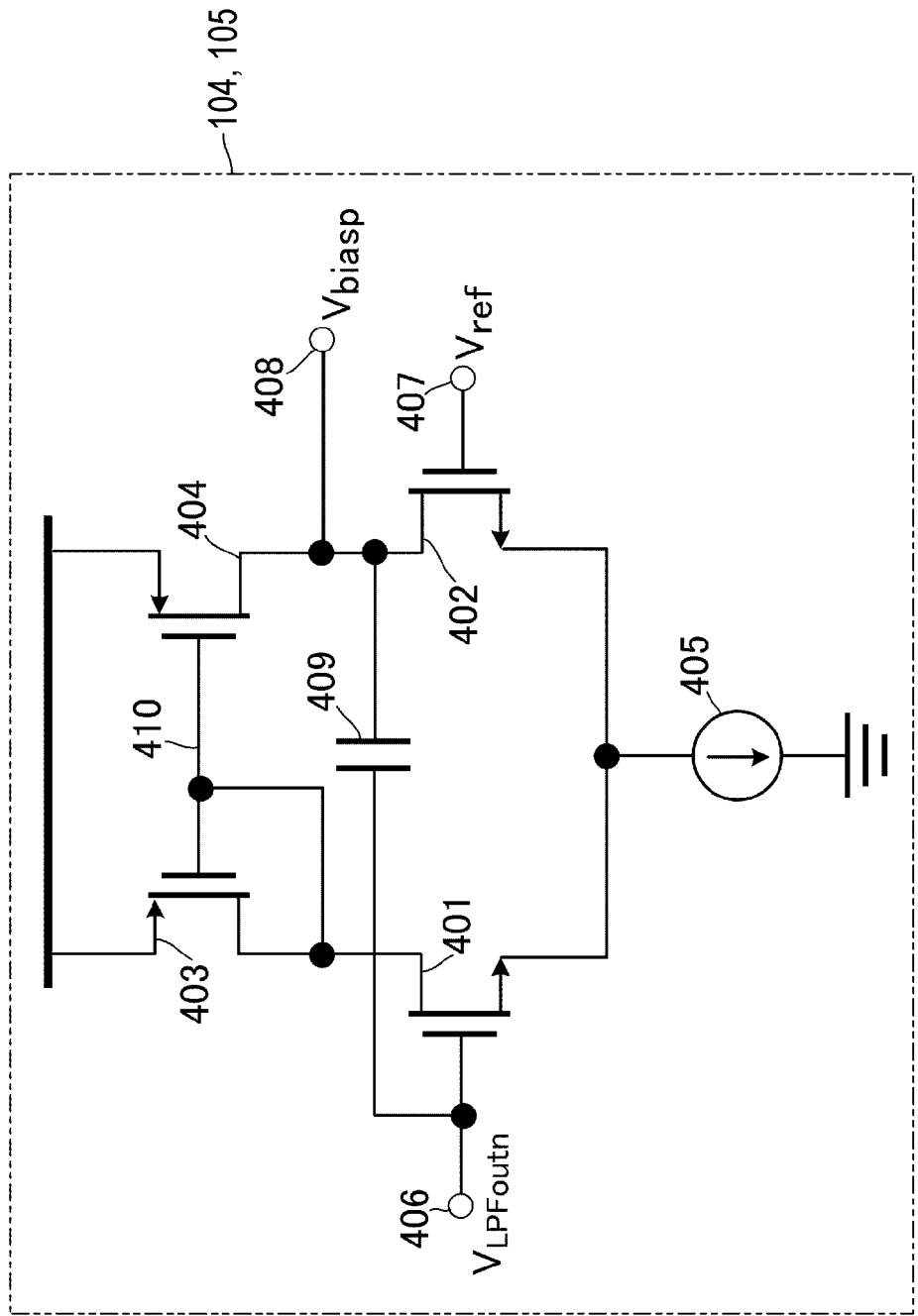
FIG. 5 is a circuit diagram illustrating an example of the circuit configuration of a comparator which constitutes the DC offset canceller according to the first exemplary embodiment.

FIG. 5 is a circuit diagram illustrating an example of the circuit configuration of the comparator 104 which constitutes the DC offset canceller 115 according to the first exemplary embodiment. As illustrated in FIG. 5, each of the comparators 104 and 105 includes an FET (a first FET) 401, an FET (a second FET) 402, a current source 405, an FET (a third FET) 403, an FET (a fourth FET) 404, and a phase compensation capacitor 409. The output of the LPF 102 or the LPF 103 is input to the gate of the FET 401. The reference voltage $V_{ref}$ generated by the reference voltage source 117 is input to the gate of the FET 402. The source of the FET 401 and the source of the FET 402 are commonly connected to one end of the current source 405, and a first voltage point (the ground) is connected to the other end. The source-drain of the FET 403 is connected between the drain of the FET 401 and a second voltage point (the power source) having a voltage that differs from that of the first voltage point. The gate of the FET 403 is connected to the drain of the FET 401. The source-drain of the FET 404 is connected between the drain of the FET 402 and the second voltage point. The gate of the FET 404 is connected to the gate of the FET 403. The phase compensation capacitor 409 is connected between the gate of the FET 401 and the drain of the FET 402. The drain voltage of the FET 402 is represented as the bias voltage $V_{biasp}$ of the differential amplifier 101.

In the comparator 104, the lowpass filter voltage $V_{LPFoutn}$ output from the LPF 102 is input to an input terminal 406 of the FET 401. The reference voltage $V_{ref}$ generated by the reference voltage source 117 is input to an input terminal 407 of the FET 402. The comparator 104 compares the lowpass filter voltage $V_{LPFoutn}$ with the reference voltage $V_{ref}$. When the lowpass filter voltage $V_{LPFoutn}$ is higher than the reference voltage $V_{ref}$, the potential of a gate terminal 410 in each of the FET 403 and the FET 404 decreases. As a result, the potential of the bias voltage $V_{biasp}$ output to an output terminal 408 of the comparator 104 increases. When the bias voltage $V_{biasp}$ increases, the output potential of the differential amplifier 101 decreases. As a result, the potential of the lowpass filter voltage $V_{LPFoutn}$ also decreases. The comparator 104 operates so that the potential of the lowpass filter voltage $V_{LPFoutn}$ is finally substantially the same as the potential of the reference voltage $V_{ref}$. In contrast, when the lowpass filter voltage $V_{LPFoutn}$ is lower than the reference voltage $V_{ref}$, the potential relationship is reversed from the above-described potential relationship. The final result is the same as the above-described result.

The comparator 105 compares the lowpass filter voltage $V_{LPFoutp}$ output from the LPF 103 with the reference voltage $V_{ref}$ generated by the reference voltage source 117. When the lowpass filter voltage $V_{LPFoutp}$ is higher than the reference voltage $V_{ref}$, the potential of a gate terminal 410 in each of the FET 403 and the FET 404 decreases. As a result, the potential of the bias voltage $V_{biasn}$ output to an output terminal 408 of the comparator 105 increases. When the bias voltage $V_{biasn}$ increases, the output potential of the differential amplifier 101 decreases. As a result, the potential of the lowpass filter voltage $V_{LPFoutp}$ also decreases. The comparator 105 operates so that the potential of the lowpass filter voltage $V_{LPFoutp}$ is finally substantially the same as the potential of the reference voltage $V_{ref}$. In contrast, when the lowpass filter voltage $V_{LPFoutp}$ is lower than the reference voltage $V_{ref}$, the potential relationship is reversed from the above-described potential relationship. The final result is the same as the above-described result.

In the configuration of the comparators 104 and 105 illustrated in FIG. 5, the amplification factor is significantly increased. Accordingly, the comparators 104 and 105 need to have frequency characteristics that do not cause oscillation by using the phase compensation capacitor 409. The phase compensation capacitor 409 is connected between the input terminal 406 and the output terminal 408. Note that the phase compensation capacitor 409 may be connected between the gate of the FET 401 and the ground (the first voltage point) or between the drain of the FET 402 and the ground (the first voltage point). Alternatively, the phase compensation capacitor 409 may be connected between the gate of the FET 401 and the power source or between the drain of the FET 402 and the power source. In addition, the current source 405 may be removed in order to allow a low-voltage operation. Furthermore, a transistor such as a bipolar junction transistor (BJT) may be used instead of each of the FETs 401 to 404.

As described above, according the DC offset cancellers 115 and 116 of the first exemplary embodiment, the LPFs 102 and 103 are disposed so as to adjacent to the output side of the differential amplifier 101 to remove an AC component contained in the output signal $V_{outn}$ output from the first output terminal of the differential amplifier 101. In addition, an AC component contained in the output signal $V_{outp}$ output from the second output terminal is removed. The lowpass filter voltage $V_{LPFoutn}$ of the output signal $V_{outn}$ without an AC component is input to one of the input terminals of the comparator 104, and the lowpass filter voltage $V_{LPFoutp}$ of the output signal $V_{outp}$ without an AC component is input to one of the input terminals of the comparator 105. In this manner, the pole frequency $f_{p1}$ and the zero frequency $f_{z1}$ do not appear in the frequency characteristics of the amplification factor of the differential amplifier 101 and, thus, degradation of the amplification characteristics on the low frequency side of the differential amplifier 101 can be prevented. In addition, since degradation of the amplification characteristics of the differential amplifier 101 on the low frequency side does not occur, the need for a circuit that compensates for the degradation can be eliminated. As a result, power consumption of the other circuits in the wireless terminal having the differential amplifier 101 incorporated thereinto is not increased and, thus, a low-power consumption system can be achieved.

Furthermore, the DC offset canceller 115 (116) according to the first exemplary embodiment includes the input terminal (the reference voltage output terminal 110) of the reference voltage source 117 and can freely determine the voltage values of the output signals $V_{outn}$ and $V_{outp}$. Accordingly, the large signal characterization is not degraded.

Modified Example of First Exemplary Embodiment

Figure 6:
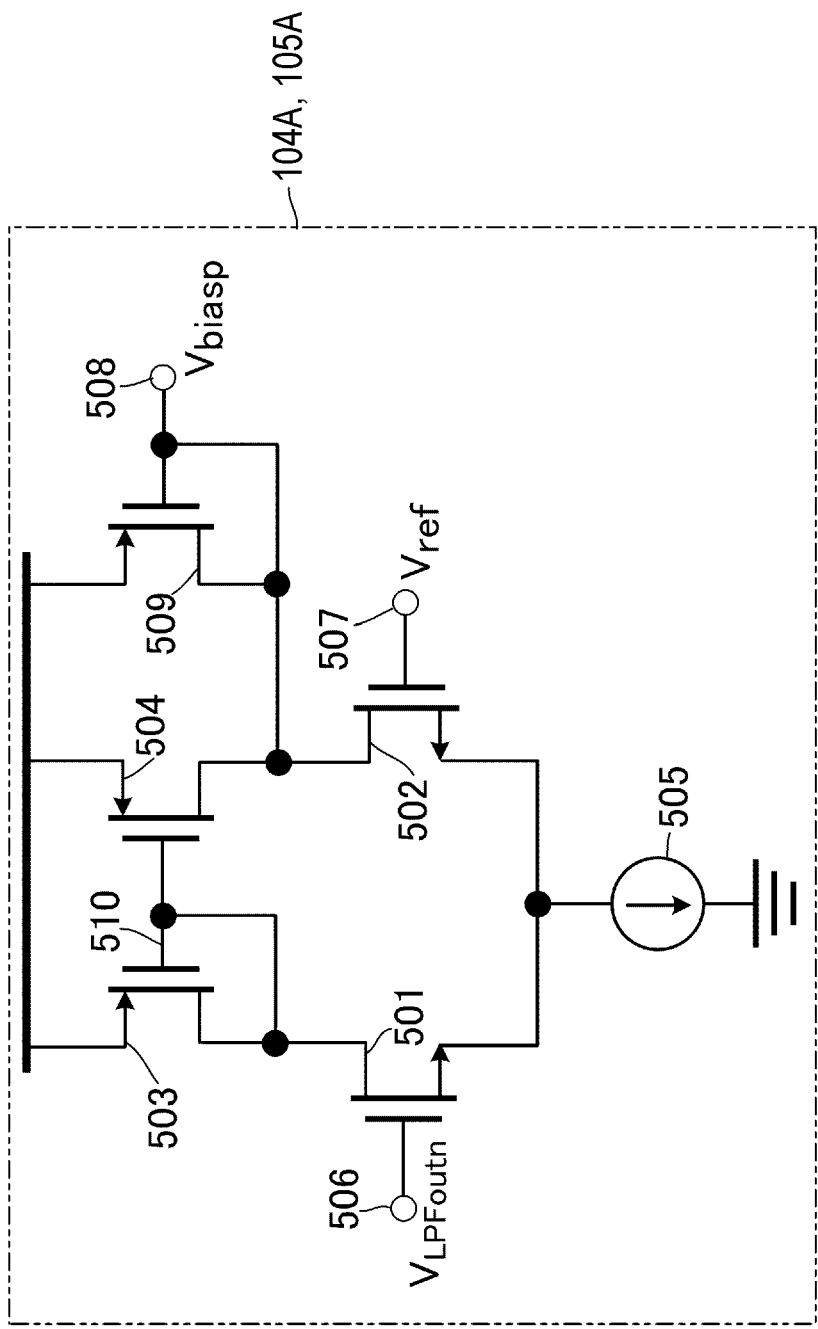
FIG. 6 is a circuit diagram illustrating the circuit configuration of a modified example of the comparator that constitutes the DC offset canceller according to the first exemplary embodiment.

FIG. 6 is a circuit diagram illustrating the circuit configuration of a modified example of the comparator that constitutes the DC offset cancellers 115 and 116 according to the first exemplary embodiment. As illustrated in FIG. 6, each of a comparator 104A serving as a first comparator and a comparator 105A serving as a second comparator includes an FET (a first FET) 501, an FET (a second FET) 502, a current source 505, an FET (a third FET) 503, an FET (a fourth FET) 504, an FET (a fifth FET) 509. The output of an LPF (a first lowpass filter) 102 or an LPF (a second lowpass filter) 103 is input to the gate of the FET 501. The reference voltage $V_{ref}$ generated by the reference voltage source 117 is input to the gate of the FET 502. The source of the FET 501 and the source of the FET 502 are commonly connected to one end of the current source 505, and a first voltage point (the ground) is connected to the other end. The source-drain of the FET 503 is connected between the drain of the FET 501 and a second voltage point (the power source) having a voltage that differs from that of the first voltage point. The gate of the FET 503 is connected to the drain of the FET 501. The source-drain of the FET 504 is connected between the drain of the FET 502 and the second voltage point. The gate of the FET 504 is connected to the gate of the FET 503. The source-drain of the FET 509 is connected between the drain of the FET 502 and the second voltage point. The gate of the FET 509 is connected to the drain of the FET 502. The drain voltage of the FET 502 is represented as the bias voltage $V_{biasp}$ of the differential amplifier 101.

The lowpass filter voltage $V_{LPFoutn}$ output from the lowpass filter 102 is input to an input terminal 506 of the FET 501. The reference voltage $V_{ref}$ generated by the reference voltage source 117 is input to an input terminal 507 of the FET 502. The comparator 104A compares the lowpass filter voltage $V_{LPFoutn}$ with the reference voltage $V_{ref}$. When the lowpass filter voltage $V_{LPFoutn}$ is higher than the reference voltage $V_{ref}$, the potential of a gate terminal 510 of each of the FET 503 and the FET 504 decreases. As a result, the potential of the bias voltage $V_{biasp}$ output to an output terminal 508 of the comparator 104A increases. When the bias voltage $V_{biasp}$ increases, the output potential of the differential amplifier 101 decreases. As a result, the potential of the lowpass filter voltage $V_{LPFoutn}$ also decreases. The comparator 104A operates so that the potential of the lowpass filter voltage $V_{LPFoutn}$ is finally substantially the same as the potential of the reference voltage $V_{ref}$. In contrast, when the lowpass filter voltage $V_{LPFoutn}$ is lower than the reference voltage $V_{ref}$, the potential relationship is reversed from the above-described potential relationship. The final result is the same as the above-described result.

The comparator 105A compares the lowpass filter voltage $V_{LPFoutp}$ output from the LPF 103 with the reference voltage $V_{ref}$ generated by the reference voltage source 117. When the lowpass filter voltage $V_{LPFoutp}$ is higher than the reference voltage $V_{ref}$, the potential of a gate terminal 510 of each of the FET 503 and the FET 504 decreases. As a result, the potential of the bias voltage $V_{biasn}$ output to an output terminal 508 of the comparator 105A increases. When the potential of the bias voltage $V_{biasn}$ increases, the output potential of the differential amplifier 101 decreases. As a result, the potential of the lowpass filter voltage $V_{LPFoutp}$ also decreases. The comparator 105A operates so that the potential of the lowpass filter voltage $V_{LPFoutp}$ is finally substantially the same as the potential of the reference voltage $V_{ref}$. In contrast, when the lowpass filter voltage $V_{LPFoutp}$ is lower than the reference voltage $V_{ref}$, the potential relationship is reversed from the above-described potential relationship. The final result is the same as the above-described result.

In the configuration of the comparators 104A and 105A illustrated in FIG. 6, the amplification factor is maintained at low levels by the FET 509. Accordingly, the need for a phase compensation capacitor can be eliminated. Thus, the dimensions can be reduced to smaller than those in configuration of the comparators 104 and 105 illustrated in FIG. 5. Note that the current source 505 may be removed in order to allow a low-voltage operation. Furthermore, a transistor such as a BJT may be used instead of the FET.

Second Exemplary Embodiment

Figure 7:
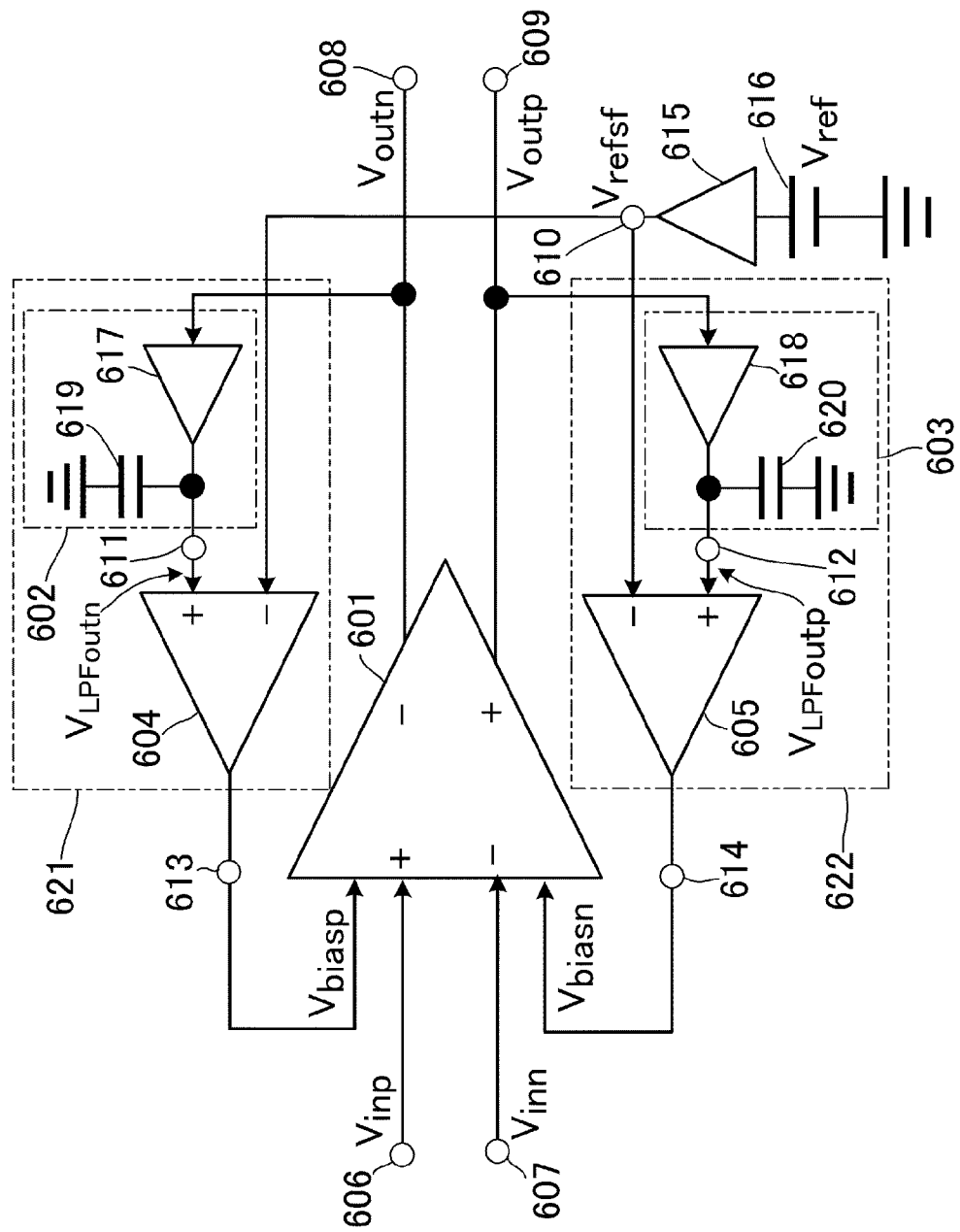
FIG. 7 is a circuit diagram illustrating an example of the circuit configuration of a DC offset canceller and a differential amplifier having the DC offset canceller connected thereto according to a second exemplary embodiment.

FIG. 7 is a circuit diagram illustrating an example of the circuit configuration of DC offset cancellers 621 and 622 and a differential amplifier 601 having the DC offset cancellers 621 and 622 connected thereto according to a second exemplary embodiment. As illustrated in FIG. 7, the DC offset canceller 621 includes an LPF (a first lowpass filter) 602 and a comparator (a first comparator) 604. The DC offset canceller 622 includes an LPF (a second lowpass filter) 603 and a comparator (a second comparator) 605.

The LPF 602 includes a source follower (a first source follower) 617 to which the voltage of a first output terminal 608 of the differential amplifier 601 is input and a capacitor (a first capacitor) 619 connected to an output terminal of the source follower 617. The differential amplifier 601 amplifies the input signal $V_{inp}$ input to a first input terminal 606 and outputs an output signal $V_{outn}$ to the first output terminal 608. The LPF 602 removes an AC component contained in the output signal $V_{outn}$ and outputs the lowpass filter voltage $V_{LPFoutn}$ to an output terminal 611. A reference voltage $V_{ref}$ generated by a reference voltage source 616 is changed to a reference voltage $V_{refsf}$ by a source follower (a third source follower) 615. The reference voltage $V_{refsf}$ is output to a reference voltage output terminal 610.

The LPF 603 includes a source follower (a second source follower) 618 to which the voltage of a second output terminal 609 of the differential amplifier 601 is input and a capacitor (a second capacitor) 620 connected to an output terminal of the source follower 618. The differential amplifier 601 amplifies the input signal $V_{inp}$ input to a second input terminal 607 and outputs the output signal $V_{outp}$ to the second output terminal 609. The LPF 603 removes an AC component contained in the output signal $V_{outp}$ and outputs the lowpass filter voltage $V_{LPFoutp}$ to an output terminal 612.

The reference voltage $V_{ref}$ generated by the reference voltage source 616 is input to each of the comparator 604 and the comparator 605 via the source follower 615. The comparator 604 compares the lowpass filter voltage $V_{LPFoutn}$ with the reference voltage $V_{refsf}$ and outputs the result of comparison to an output terminal 613. By using the bias voltage $V_{biasp}$ output from the comparator 604 to an output terminal 613, control is performed so that the output DC voltage output to the first output terminal 608 of the differential amplifier 601 is the same as the reference voltage $V_{ref}$. As a result, the DC offset is removed. The comparator 605 compares the lowpass filter voltage $V_{LPFoutp}$ with the reference voltage $V_{refsf}$ and outputs the result of comparison to an output terminal 614. By using the bias voltage $V_{biasn}$ output from the comparator 605 to the output terminal 614, control is performed so that the output DC voltage output to the second output terminal 609 of the differential amplifier 601 is the same as the reference voltage $V_{ref}$. As a result, the DC offset is removed. Note that each of the source followers 615, 617, and 618 may be an emitter follower circuit.

According to the DC offset cancellers 621 and 622 having such a configuration, even when the differential amplifier 601 has a configuration that is the same as that of the differential amplifier illustrated in FIG. 10, the LPF 602 does not serve as the load of the input terminal 911 from the viewpoint of the input terminal 909. In addition, the LPF 603 does not serve as the load of the input terminal 912 from the viewpoint of the input terminal 910. Accordingly, the equivalent circuit of a signal path from the input terminal 909 to the input terminal 911 is the same as the result obtained using the DC offset cancellers 115 and 116 according to the first exemplary embodiment and, thus, is the same as the equivalent circuit 202 illustrated in FIG. 2. Therefore, the transfer function of a path from the input signal $V_{inp}$ to an input signal $V_{inp2}$ is expressed as follows:

$$V_{inp2}/V_{inp} = (C_1 * R_1 * s)/(1 + C_1 * R_1 * s).$$

Thus, for the same reason as in the case of the DC offset cancellers 115 and 116 according to the first exemplary embodiment, the amplification factor on the low frequency side of the differential amplifier 601 does not decrease and, thus, the amplification factor of the differential amplifier 601 itself can be realized. As a result, an increase in power consumption of other circuits of the wireless terminal having the differential amplifier 601 incorporated thereinto does not occur. In this manner, a low power consumption system can be achieved.

Furthermore, since the LPFs 602 and 603 are configured using the source followers 617 and 618, respectively, the input resistance of each of the source followers 617 and 618 is sufficiently high, as compared with the output resistance of the differential amplifier 601 at the frequency range of the amplification factor of the differential amplifier 601. Thus, the output load of the differential amplifier 601 is not affected. As a result, the frequency characteristics of the amplification factor of the differential amplifier 601 are not degraded. By removing the impact of the DC offset cancellers 621 and 622, the amplification factor of the differential amplifier 601 indicated by the frequency characteristic 201 can be achieved. Since the input resistance of each of the LPFs 602 and 603 does not depend on the cutoff frequencies of the LPFs 602 and 603, a flexible design can be adapted, as compared with the DC offset cancellers 115 and 116 according to the first exemplary embodiment. Note that the same advantage can be provided even when an emitter follower is used instead of the source follower.

Figure 8:
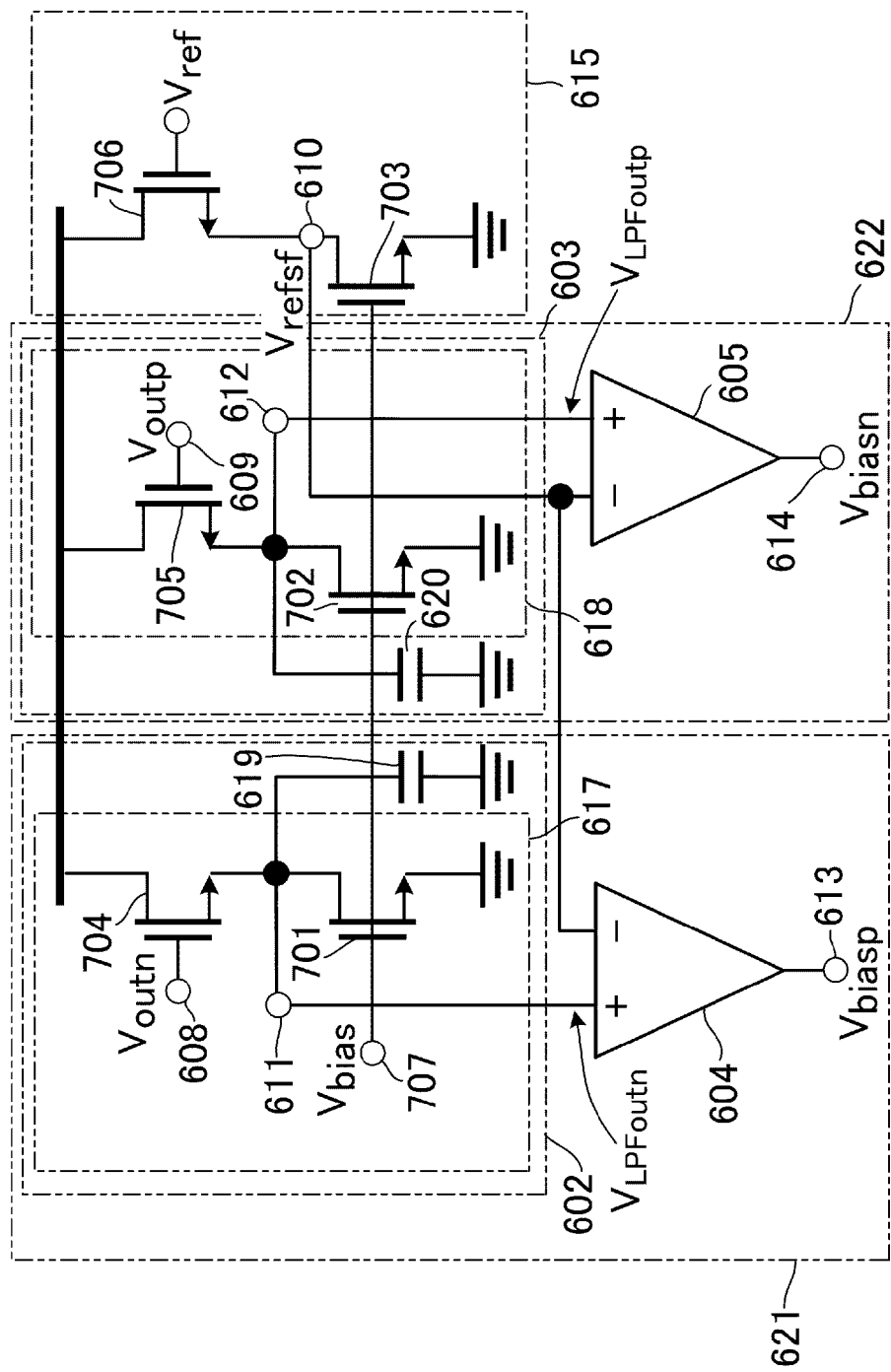
FIG. 8 is a detailed circuit diagram illustrating an example of the circuit configuration of the DC offset canceller according to the second exemplary embodiment.

FIG. 8 is a detailed circuit diagram illustrating an example of the circuit configuration of the DC offset cancellers 621 and 622 according to the second exemplary embodiment. As illustrated in FIG. 8, the source follower 617 includes an FET (a first FET) 701 and an FET (a second FET) 704. The gate of the FET 701 is connected to a current bias voltage source (not illustrated), and the source of the FET 701 is connected to the first voltage point (the ground). The drain of the FET 701 is connected to the source of the FET 704. The drain of the FET 704 is connected to a second voltage point (the power source) having a predetermined voltage value that differs from the voltage at the first voltage point. The gate of the FET 704 serves as an input terminal, and the drain of the FET 701 serves as the output terminal 611. The output signal $V_{outn}$ output from the differential amplifier 601 is input to the gate of the FET 704. A bias voltage $V_{bias}$ is input to the gate of the FET 701 via a terminal 707. When the FET 704 is an n-type FET, the output signal $V_{outn}$ input to the source follower 617 is output to the output terminal 611 of the source follower 617 as the lowpass filter voltage $V_{LPFoutn}$ having a DC component reduced by a threshold value Vth of the FET 704. However, when the FET 704 is a p-type FET, a signal having a DC component increased from that of the output signal $V_{outn}$ by a substantially threshold value Vth.

The capacitor (the first capacitor) 619 is connected between the output terminal 611 of the source follower 617 and the ground. Note that the capacitor 619 may be connected between the output terminal 611 of the source follower 617 and the power source. By connecting the capacitor 619, common mode noise can be removed. In addition, the total area of the capacitors can be reduced.

The source follower 618 includes an FET (a first FET) 702 and an FET (a second FET) 705. The gate of the FET 702 is connected to the current bias voltage source, and the source of the FET 702 is connected to the first voltage point. The drain of the FET 702 is connected to the source of the FET 705. The drain of the FET 705 is connected to a second voltage point having a predetermined voltage value that differs from the voltage at the first voltage point. The gate of the FET 705 serves as an input terminal, and the drain of the FET 702 serves as the output terminal 612. The output signal $V_{outp}$ output from the differential amplifier 601 is input to the gate of the FET 705. The bias voltage $V_{bias}$ is input to the gate of the FET 702 via the terminal 707. When the FET 705 is an n-type FET, the output signal $V_{outp}$ input to the source follower 618 is output to the output terminal 612 of the source follower 618 as the lowpass filter voltage $V_{LPFoutp}$ having a DC component reduced by a threshold value Vth of the FET 705. However, when the FET 705 is a p-type FET, a signal having a DC component increased from that of the output signal $V_{outp}$ by a substantially threshold value Vth.

The capacitor (second capacitor) 620 is connected between the output terminal 612 of the source follower 618 and the ground. Note that the capacitor 620 may be connected between the output terminal 612 of the source follower 618 and the power source. By connecting the capacitor 620, in-phase noise can be removed. In addition, the total area of the capacitors can be reduced.

The source follower 615 includes an FET (a first FET) 703 and an FET (a second FET) 706. The gate of the FET 703 is connected to the current bias voltage source, and the source of the FET 703 is connected to the first voltage point. The drain of the FET 703 is connected to the source of the FET 706. The drain of the FET 706 is connected to a second voltage point having a predetermined voltage value that differs from the voltage at the first voltage point. The gate of the FET 706 serves as an input terminal, and the drain of the FET 703 serves as the reference voltage output terminal 610. The reference voltage $V_{ref}$ generated by the reference voltage source 616 is input to the gate of the FET 706. The bias voltage $V_{bias}$ is input to the gate of the FET 703 via the terminal 707.

To accurately compare each of the lowpass filter voltages $V_{LPFoutn}$ and $V_{LPFoutp}$ with the reference voltage $V_{refsf}$ the source follower 615 has a configuration using FETs having the same configuration and size as in the source followers 617 and 618. The reference voltage $V_{refsf}$ that is changed from the reference voltage $V_{ref}$ varied in the same manner as in the source followers 617 and 618 by Vth is output to the reference voltage output terminal 610 via the source follower 615.

The comparator 604 compares the lowpass filter voltage $V_{LPFoutn}$ with the reference voltage $V_{refsf}$, and the comparator 605 compares the lowpass filter voltage $V_{LPFoutp}$ with the reference voltage $V_{refsf}$. The results of comparison are output to the output terminals 613 and 614 as the bias voltages $V_{biasp}$ and $V_{biasn}$, respectively. By using the bias voltages $V_{biasp}$ and $V_{biasn}$, the output DC potential of the differential amplifier 601 is made to be the same as the reference voltage $V_{refsf}$. As a result, the DC offset is canceled out. Note that the source follower need not be an FET but may be an emitter follower formed by a BJT.

As described above, according to the DC offset cancellers 621 and 622 of the second exemplary embodiment, the same advantages as those of the DC offset cancellers 115 and 116 of the first exemplary embodiment can be provided. In addition, since the LPFs 602 and 603 are formed using the source followers 617 and 618, the frequency characteristics of the amplification factor of the differential amplifier 601 are not degraded, and the amplification factor of the differential amplifier 601 that is not affected by the DC offset cancellers 621 and 622 can be provided. Furthermore, since the input resistance of each of the LPFs 602 and 603 does not depend on the cutoff frequencies of the LPFs 602 and 603, a flexible design can be adapted, as compared with the DC offset cancellers 115 and 116 according to the first exemplary embodiment.

Modified Example of Second Exemplary Embodiment

Figure 9:
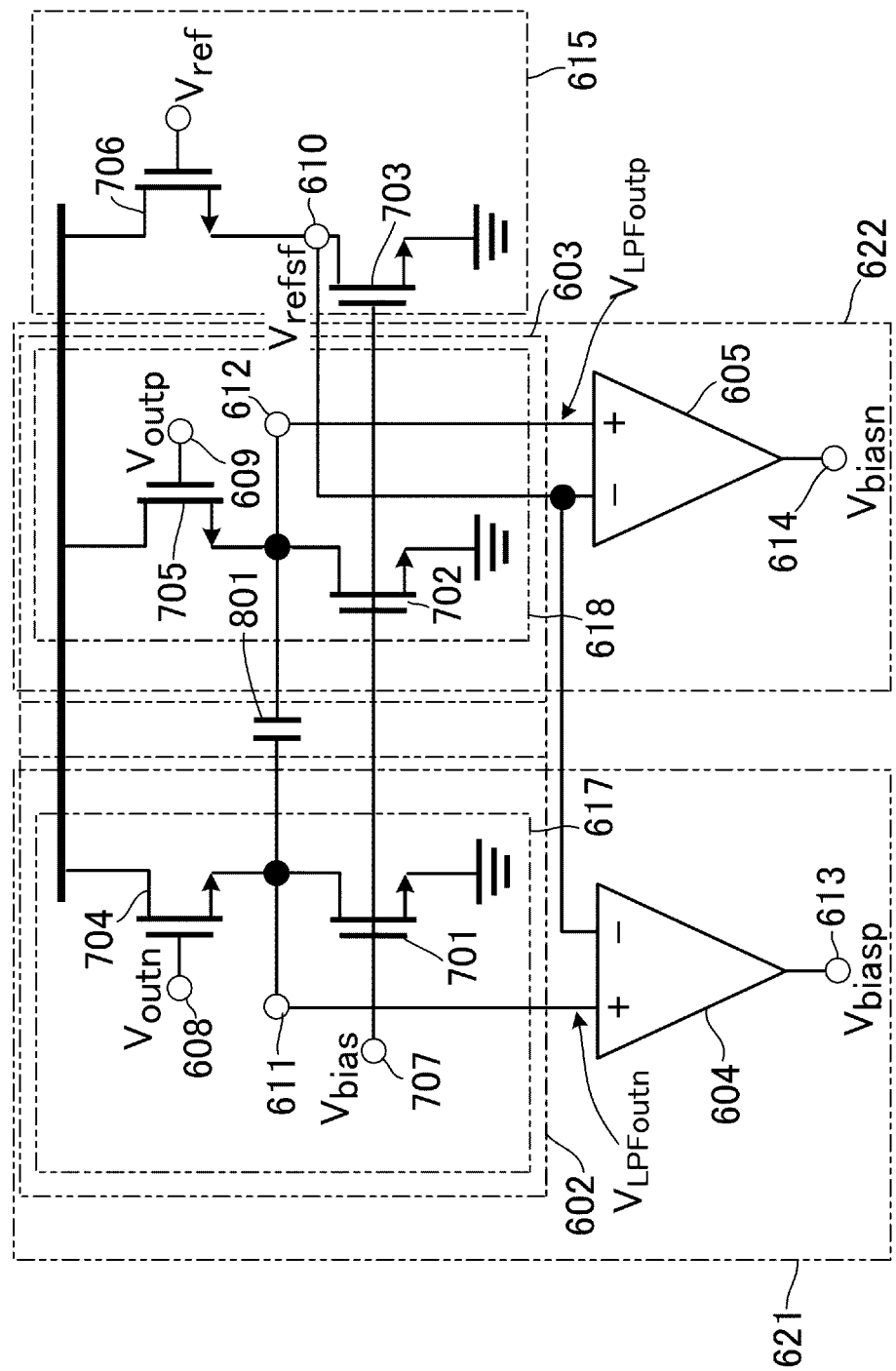
FIG. 9 is a circuit diagram illustrating the circuit configuration of a modified example of the DC offset canceller according to the second exemplary embodiment.

FIG. 9 is a circuit diagram illustrating the circuit configuration of a modified example of the DC offset cancellers 621 and 622 in detail according to the second exemplary embodiment. In the DC offset cancellers 621 and 622 according to the second exemplary embodiment, the capacitor 619 is connected between the output terminal 611 of the source follower 617 and the ground. The capacitor 620 is connected between the output terminal 612 of the source follower 618 and the ground. In contrast, according to the modified example of the DC offset cancellers 621 and 622 of the second exemplary embodiment, a capacitor 801 is connected between the output terminal of the LPF 602 and the output terminal of the LPF 603. In this manner, the installation area of the capacitors can be reduced to one half of that in the DC offset cancellers 621 and 622 according to the second exemplary embodiment including two capacitors.

Outline of Embodiment of Present Disclosure

A first DC offset canceller of the disclosure is a DC offset canceller used in a differential amplifier. The DC offset canceller includes a first lowpass filter to which a voltage of a first output terminal of the differential amplifier is input, a first comparator to which an output of the first lowpass filter and a reference voltage generated by a reference voltage source are input, an output of the first comparator being input to a first output DC voltage control terminal of the differential amplifier, a second lowpass filter to which a voltage of a second output terminal of the differential amplifier is input, and a second comparator to which an output of the second lowpass filter and the reference voltage generated by the reference voltage source are input, an output of the second comparator being input to a second output DC voltage control terminal of the differential amplifier.

A second DC offset canceller of the disclosure is the first DC offset canceller including the first lowpass filter and the second lowpass filter each having a single stage or multiple stages.

A third DC offset canceller of the disclosure is the first or second DC offset canceller including the first lowpass filter and the second lowpass filter each including a resistor and a capacitor.

A fourth DC offset canceller of the disclosure is the third DC offset canceller including the resistor serving as a passive element or an active element and the capacitor serving as a passive element or an active element.

A fifth DC offset canceller of the disclosure is the first or second DC offset canceller including the first lowpass filter and the second lowpass filter each including an inductor and a capacitor.

A sixth DC offset canceller of the disclosure is the fifth DC offset canceller including the inductor serving as a passive inductor formed from a passive element or an active inductor formed from an active element and the capacitor serving as a passive element or an active element.

A seventh DC offset canceller of the disclosure is the first or second DC offset canceller including the first lowpass filter and the second lowpass filter each including: one of an operational amplifier and a transconductance amplifier; a capacitor; and a resistor.

An eighth DC offset canceller of the disclosure is any one of the first to seventh DC offset cancellers. Each of the first comparator and the second comparator includes: a first FET having a gate, to which the output of the first lowpass filter or the second lowpass filter is input; a second FET having a gate, to which the reference voltage generated by the reference voltage source is input, a current source having one end, which is commonly connected to a source of the first FET and a source of the second FET, and the other end connected to a first voltage point; a third FET having a source-drain, which is connected between the drain of the first FET and a second voltage point having a predetermined voltage value that differs from the voltage value of the first voltage point, and a gate connected to the drain of the first FET; a fourth FET having a source-drain, which is connected between the drain of the second FET and the second voltage point, and a gate connected to the gate of the third FET; and a phase compensation capacitor connected between the gate of the first FET and the drain of the second FET. A drain voltage of the second FET is used as an output DC voltage control signal for the differential amplifier.

A ninth DC offset canceller of the disclosure is any one of the first to seventh DC offset cancellers. Each of the first comparator and the second comparator includes: a first BJT having a base, to which the output of the first lowpass filter or the second lowpass filter is input; a second BJT having a base, to which the reference voltage generated by the reference voltage source is input; a current source having one end, which is commonly connected to an emitter of the first BJT and an emitter of the second BJT, and the other end connected to a first voltage point; a third BJT having an emitter-collector, which is connected between the collector of the first BJT and a second voltage point having a predetermined voltage value that differs from a voltage value of the first voltage point, and a base connected to the collector of the first BJT; a fourth BJT having an emitter-collector, which is connected between the collector of the second BJT and the second voltage point, and a base connected to the base of the third BJT; and a phase compensation capacitor connected between the base of the first BJT and the collector of the second BJT. A collector voltage of the second BJT is used as an output DC voltage control signal for the differential amplifier.

A tenth DC offset canceller of the disclosure is any one of the first to seventh DC offset cancellers. Each of the first comparator and the second comparator includes: a first FET having a gate, to which the output of the first lowpass filter or the second lowpass filter is input; a second FET having a gate, to which the reference voltage generated by the reference voltage source is input; a current source having one end, which is commonly connected to a source of the first FET and a source of the second FET, and the other end connected to a first voltage point; a third FET having a source-drain, which is connected between the drain of the first FET and a second voltage point having a predetermined voltage value that differs from a voltage value of the first voltage point, and a gate connected to the drain of the first FET; a fourth FET having a source-drain, which is connected between the drain of the second FET and the second voltage point, and a gate connected to the gate of the third FET; and a phase compensation capacitor connected between the gate of the first FET and the first voltage point. The drain voltage of the second FET is used as an output DC voltage control signal for the differential amplifier.

An eleventh DC offset canceller of the disclosure is any one of the first to seventh DC offset cancellers. Each of the first comparator and the second comparator includes: a first BJT having a base, to which the output of the first lowpass filter or the second lowpass filter is input; a second BJT having a base, to which the reference voltage generated by the reference voltage source is input; a current source having one end, which is commonly connected to an emitter of the first BJT and an emitter of the second BJT, and the other end connected to a first voltage point; a third BJT having an emitter-collector, which is connected between the collector of the first BJT and a second voltage point having a predetermined voltage value that differs from a voltage value of the first voltage point, and a base connected to the collector of the first BJT; a fourth BJT having an emitter-collector, which is connected between the collector of the second BJT and the second voltage point, and a base connected to the base of the third BJT; and a phase compensation capacitor connected between the base of the first BJT and the first voltage point. A collector voltage of the second BJT is used as an output DC voltage control signal for the differential amplifier.

A twelfth DC offset canceller of the disclosure is any one of the first to seventh DC offset cancellers. Each of the first comparator and the second comparator includes: a first FET having a gate, to which the output of the first lowpass filter or the second lowpass filter is input; a second FET having a gate, to which the reference voltage generated by the reference voltage source is input; a current source having one end, which is commonly connected to a source of the first FET and a source of the second FET, and the other end connected to a first voltage point; a third FET having a source-drain, which is connected between the drain of the first FET and a second voltage point having a predetermined voltage value that differs from a voltage value of the first voltage point, and a gate connected to the drain of the first FET; a fourth FET having a source-drain, which is connected between the drain of the second FET and the second voltage point, and a gate connected to the gate of the third FET; and a phase compensation capacitor connected between the drain of the second FET and the first voltage point. A drain voltage of the second FET is used as an output DC voltage control signal for the differential amplifier.

A thirteenth DC offset canceller of the disclosure is any one of the first to seventh DC offset cancellers. Each of the first comparator and the second comparator includes: a first BJT having a base, to which the output of the first lowpass filter or the second lowpass filter is input; a second BJT having a base, to which the reference voltage generated by the reference voltage source is input; a current source having one end, which is commonly connected to an emitter of the first BJT and an emitter of the second BJT, and the other end connected to a first voltage point; a third BJT having an emitter-collector, which is connected between the collector of the first BJT and a second voltage point having a predetermined voltage value that differs from a voltage value of the first voltage point, and a base connected to the collector of the first BJT; a fourth BJT having an emitter-collector, which is connected between the collector of the second BJT and the second voltage point, and a base connected to the base of the third BJT; and a phase compensation capacitor connected between the collector of the second BJT and the first voltage point. The collector voltage of the second BJT is used as an output DC voltage control signal for the differential amplifier.

A fourteenth DC offset canceller of the disclosure is any one of the first to seventh DC offset cancellers. Each of the first comparator and the second comparator includes: a first FET having a gate, to which the output of the first lowpass filter or the second lowpass filter is input; a second FET having a gate, to which the reference voltage generated by the reference voltage source is input; a current source having one end, which is commonly connected to a source of the first FET and a source of the second FET, and the other end connected to a first voltage point; a third FET having a source-drain, which is connected between the drain of the first FET and a second voltage point having a predetermined voltage value that differs from a voltage value of the first voltage point, and a gate connected to the drain of the first FET; a fourth FET having a source-drain, which is connected between the drain of the second FET and the second voltage point, and a gate connected to the gate of the third FET; and a fifth FET having a source-drain, which is connected between the drain of the second FET and the second voltage point, and a gate connected to the drain of the second FET. The drain voltage of the second FET is used as an output DC voltage control signal for the differential amplifier.

In addition, a fifteenth DC offset canceller of the disclosure is any one of the first to seventh DC offset cancellers. Each of the first comparator and the second comparator includes: a first BJT having a base, to which the output of the first lowpass filter or the second lowpass filter is input; a second BJT having a base, to which the reference voltage generated by the reference voltage source is input; a current source having one end, which is commonly connected to an emitter of the first BJT and an emitter of the second BJT, and the other end connected to a first voltage point; a third BJT having an emitter-collector, which is connected between the collector of the first BJT and a second voltage point having a predetermined voltage value that differs from a voltage value of the first voltage point, and a base connected to the collector of the first BJT; a fourth BJT having an emitter-collector, which is connected between the collector of the second BJT and the second voltage point, and a base connected to the base of the third BJT; and a fifth BJT having an emitter-collector, which is connected between the collector of the second BJT and the second voltage point, and a base connected to the collector of the second BJT. A collector voltage of the second BJT is used as an output DC voltage control signal for the differential amplifier.

A sixteenth DC offset canceller of the disclosure is the first DC offset canceller including: the first lowpass filter that includes a first source follower to which a voltage of a first output terminal of the differential amplifier is input; and a first capacitor connected to an output terminal of the first source follower; and the second lowpass filter that includes a second source follower to which a voltage of a second output terminal of the differential amplifier is input and a second capacitor connected to an output terminal of the second source follower. The reference voltage generated by the reference voltage source is input to each of the first comparator and the second comparator via a third source follower.

A seventeenth DC offset canceller of the disclosure is the first DC offset canceller including: the first lowpass filter that includes a first emitter follower to which a voltage of the first output terminal of the differential amplifier is input and a first capacitor connected to an output terminal of the first emitter follower; and the second lowpass filter that includes a second emitter follower to which a voltage of a second output terminal of the differential amplifier is input and a second capacitor connected to an output terminal of the second emitter follower. The reference voltage generated by the reference voltage source is input to each of the first comparator and the second comparator via a third emitter follower.

An eighteenth DC offset canceller of the disclosure is the sixteenth DC offset canceller. Each of the first source follower, the second source follower, and the third source follower includes: a first FET having a gate, which is connected to a current bias voltage source, and a source connected to the first voltage point; and a second FET having a source connected to a drain of the first FET, having a drain connected to the second voltage point having a predetermined voltage value that differs from a voltage value of the first voltage point, and having a gate serving as an input terminal. The drain of the first FET serves as an output terminal.

A nineteenth DC offset canceller of the disclosure is the seventeenth DC offset canceller. Each of the first emitter follower, the second emitter follower, and the third emitter follower includes a first BJT having a base, which is connected to a current bias voltage source, and an emitter connected to the first voltage point; and the second BJT having an emitter connected to a collector of the first BJT, having a collector connected to the second voltage point having a predetermined voltage value that differs from a voltage value of the first voltage point, and having a base serving as an input terminal. The collector of the first BJT serves as an output terminal.

A twentieth DC offset canceller of the disclosure is the sixteenth DC offset canceller including the first lowpass filter that includes the first capacitor connected between the output terminal of the first source follower and a first voltage point and the second lowpass filter that includes the second capacitor connected between the output terminal of the second source follower and the first voltage point.

A twenty-first DC offset canceller of the disclosure is the seventeenth DC offset canceller including the first lowpass filter that includes the first capacitor connected between the output terminal of the first emitter follower and the first voltage point and the second lowpass filter that includes the second capacitor connected between the output terminal of the second emitter follower and a first voltage point.

In addition, a twenty-second DC offset canceller of the disclosure is the first DC offset canceller including the first lowpass filter and the second lowpass filter sharing a capacitor connected between the output terminal of the first lowpass filter and the output terminal of the second lowpass filter.

While the exemplary embodiments have been described with reference to accompanying drawings, it is to be understood that the disclosure is not limited to the exemplary embodiments. Various modifications and alterations of this disclosure will become apparent to those skilled in the art without departing from the scope and principles of the appended claims, and it should be understood that the various modifications and alterations are to be included in the technical scope of the invention.

The present disclosure is useful to a current reuse type differential amplifier. For example, the present disclosure is useful to a differential amplifier for each of wireless terminals in a wireless sensor network system that requires low power consumption.

CROSS REFERENCE TO RELATED APPLICATION

The present application claims the benefit of Japanese Patent Application No. 2013-267110 filed on Dec. 25, 2013 and Japanese Patent Application No. 2014-241080 filed on Nov. 28, 2014. The entire disclosure of the above-identified applications, including the specifications, drawings and claims, is incorporated herein by reference in its entirety.

What is claimed is:

1. A DC offset canceller for use in a differential amplifier, comprising:
 a first lowpass filter to which a voltage of a first output terminal of the differential amplifier is input;
 a first comparator to which an output of the first lowpass filter and a reference voltage generated by a reference voltage source are input, an output of the first comparator being input to a first output DC voltage control terminal of the differential amplifier;
 a second lowpass filter to which a voltage of a second output terminal of the differential amplifier is input; and
 a second comparator to which an output of the second lowpass filter and the reference voltage generated by the reference voltage source are input, an output of the second comparator being input to a second output DC voltage control terminal of the differential amplifier.

2. The DC offset canceller according to claim 1, wherein each of the first lowpass filter and the second lowpass filter has a single stage or multiple stages.

3. The DC offset canceller according to claim 1, wherein each of the first lowpass filter and the second lowpass filter includes a resistor and a capacitor.

4. The DC offset canceller according to claim 3, wherein the resistor serves as a passive element or an active element, and the capacitor serves as a passive element or an active element.

5. The DC offset canceller according to claim 1, wherein each of the first lowpass filter and the second lowpass filter includes an inductor and a capacitor.

6. The DC offset canceller according to claim 5, wherein the inductor serves as a passive inductor formed from a passive element or an active inductor formed from an active element, and the capacitor serves as a passive element or an active element.

7. The DC offset canceller according to claim 1, wherein each of the first lowpass filter and the second lowpass filter includes: one of an operational amplifier and a transconductance amplifier; a capacitor; and a resistor.

8. The DC offset canceller according to claim 1, wherein each of the first comparator and the second comparator includes:
 a first FET having a gate, to which the output of the first lowpass filter or the second lowpass filter is input;
 a second FET having a gate, to which the reference voltage generated by the reference voltage source is input;
 a current source having one end, which is commonly connected to a source of the first FET and a source of the second FET, and the other end connected to a first voltage point;
 a third FET having a source-drain, which is connected between the drain of the first FET and a second voltage point having a predetermined voltage value that differs from a voltage value of the first voltage point, and a gate connected to the drain of the first FET;
 a fourth FET having a source-drain, which is connected between the drain of the second FET and the second voltage point, and a gate connected to the gate of the third FET; and
 a phase compensation capacitor connected between the gate of the first FET and the drain of the second FET,
 wherein a drain voltage of the second FET is used as an output DC voltage control signal for the differential amplifier.

9. The DC offset canceller according to claim 1, wherein each of the first comparator and the second comparator includes:
 a first BJT having a base, to which the output of the first lowpass filter or the second lowpass filter is input;
 a second BJT having a base, to which the reference voltage generated by the reference voltage source is input;
 a current source having one end, which is commonly connected to an emitter of the first BJT and an emitter of the second BJT, and the other end connected to a first voltage point;
 a third BJT having an emitter-collector, which is connected between the collector of the first BJT and a second voltage point having a predetermined voltage value that differs from a voltage value of the first voltage point, and a base connected to the collector of the first BJT;
 a fourth BJT having an emitter-collector, which is connected between the collector of the second BJT and the second voltage point, and a base connected to the base of the third BJT; and
 a phase compensation capacitor connected between the base of the first BJT and the collector of the second BJT,
 wherein a collector voltage of the second BJT is used as an output DC voltage control signal for the differential amplifier.

10. The DC offset canceller according to claim 1, wherein each of the first comparator and the second comparator includes:
 a first FET having a gate, to which the output of the first lowpass filter or the second lowpass filter is input;
 a second FET having a gate, to which the reference voltage generated by the reference voltage source is input;
 a current source having one end, which is commonly connected to a source of the first FET and a source of the second FET, and the other end connected to a first voltage point;
 a third FET having a source-drain, which is connected between the drain of the first FET and a second voltage point having a predetermined voltage value that differs from a voltage value of the first voltage point, and a gate connected to the drain of the first FET;
 a fourth FET having a source-drain, which is connected between the drain of the second FET and the second voltage point, and a gate connected to the gate of the third FET; and
 a phase compensation capacitor, which is connected between the gate of the first FET and the first voltage point or connected between the drain of the second FET and the first voltage point,
 wherein the drain voltage of the second FET is used as an output DC voltage control signal for the differential amplifier.

11. The DC offset canceller according to claim 1, wherein each of the first comparator and the second comparator includes:
 a first BJT having a base, to which the output of the first lowpass filter or the second lowpass filter is input;
 a second BJT having a base, to which the reference voltage generated by the reference voltage source is input;
 a current source having one end, which is commonly connected to an emitter of the first BJT and an emitter of the second BJT, and the other end connected to a first voltage point;

a third BJT having an emitter-collector, which is connected between the collector of the first BJT and a second voltage point having a predetermined voltage value that differs from a voltage value of the first voltage point, and a base connected to the collector of the first BJT;

a fourth BJT having an emitter-collector, which is connected between the collector of the second BJT and the second voltage point, and a base connected to the base of the third BJT; and a phase compensation capacitor, which is connected between the base of the first BJT and the first voltage point or connected between the collector of the second BJT and the first voltage point, wherein a collector voltage of the second BJT is used as an output DC voltage control signal for the differential amplifier.

12. The DC offset canceller according to claim 1, wherein each of the first comparator and the second comparator includes:

a first FET having a gate, to which the output of the first lowpass filter or the second lowpass filter is input;

a second FET having a gate, to which the reference voltage generated by the reference voltage source is input;

a current source having one end, which is commonly connected to a source of the first FET and a source of the second FET, and the other end connected to a first voltage point;

a third FET having a source-drain, which is connected between the drain of the first FET and a second voltage point having a predetermined voltage value that differs from a voltage value of the first voltage point, and a gate connected to the drain of the first FET;

a fourth FET having a source-drain, which is connected between the drain of the second FET and the second voltage point, and a gate connected to the gate of the third FET; and a fifth FET having a source-drain, which is connected between the drain of the second FET and the second voltage point, and a gate connected to the drain of the second FET, wherein a drain voltage of the second FET is used as an output DC voltage control signal for the differential amplifier.

13. The DC offset canceller according to claim 1, wherein each of the first comparator and the second comparator includes:

a first BJT having a base, to which the output of the first lowpass filter or the second lowpass filter is input;

a second BJT having a base, to which the reference voltage generated by the reference voltage source is input;

a current source having one end, which is commonly connected to an emitter of the first BJT and an emitter of the second BJT, and the other end connected to a first voltage point;

a third BJT having an emitter-collector, which is connected between the collector of the first BJT and a second voltage point having a predetermined voltage value that differs from a voltage value of the first voltage point, and a base connected to the collector of the first BJT;

a fourth BJT having an emitter-collector, which is connected between the collector of the second BJT and the second voltage point, and a base connected to the base of the third BJT; and a fifth BJT having an emitter-collector, which is connected between the collector of the second BJT and the second voltage point, and a base connected to the collector of the second BJT, wherein a collector voltage of the second BJT is used as an output DC voltage control signal for the differential amplifier.

14. The DC offset canceller according to claim 1, wherein the first lowpass filter includes: a first source follower to which a voltage of a first output terminal of the differential amplifier is input; and a first capacitor connected to an output terminal of the first source follower, wherein the second lowpass filter includes: a second source follower to which a voltage of a second output terminal of the differential amplifier is input; and a second capacitor connected to an output terminal of the second source follower, and wherein the reference voltage generated by the reference voltage source is input to each of the first comparator and the second comparator via a third source follower.

15. The DC offset canceller according to claim 1, wherein the first lowpass filter includes: a first emitter follower to which a voltage of a first output terminal of the differential amplifier is input; and a first capacitor connected to an output terminal of the first emitter follower, wherein the second lowpass filter includes: a second emitter follower to which a voltage of a second output terminal of the differential amplifier is input; and a second capacitor connected to an output terminal of the second emitter follower, and wherein the reference voltage generated by the reference voltage source is input to each of the first comparator and the second comparator via a third emitter follower.

16. The DC offset canceller according to claim 14, wherein each of the first source follower, the second source follower, and the third source follower includes:

a first FET having a gate, which is connected to a current bias voltage source, and a source connected to the first voltage point; and a second FET having a source connected to a drain of the first FET, having a drain connected to the second voltage point having a predetermined voltage value that differs from a voltage value of the first voltage point, and having a gate serving as an input terminal, wherein the drain of the first FET serves as an output terminal.

17. The DC offset canceller according to claim 15, wherein each of the first emitter follower, the second emitter follower, and the third emitter follower includes:

a first BJT having a base, which is connected to a current bias voltage source, and an emitter connected to the first voltage point; and a second BJT having an emitter connected to a collector of the first BJT, having a collector connected to the second voltage point having a predetermined voltage value that differs from a voltage value of the first voltage point, and having a base serving as an input terminal, and wherein the collector of the first BJT serves as an output terminal.

18. The DC offset canceller according to claim 14, wherein the first lowpass filter includes the first capacitor connected between the output terminal of the first source follower and a first voltage point, and wherein the second lowpass filter includes the second capacitor connected between the output terminal of the second source follower and the first voltage point.

19. The DC offset canceller according to claim 15, wherein the first lowpass filter includes the first capacitor connected between the output terminal of the first emitter follower and a first voltage point, and wherein the second lowpass filter includes the second capacitor connected between the output terminal of the second emitter follower and the first voltage point.

20. The DC offset canceller according to claim 1, wherein the first lowpass filter and the second lowpass filter share a capacitor connected between the output terminal of the first lowpass filter and the output terminal of the second lowpass filter.

\* \* \* \* \*